(12) United States Patent
Kato

(10) Patent No.: US 8,797,225 B2
(45) Date of Patent: Aug. 5, 2014

(54) ANTENNA DEVICE AND COMMUNICATION TERMINAL APPARATUS

(71) Applicant: Murata Manufacturing Co., Ltd., Nagaokakyo (JP)

(72) Inventor: Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/019,573

(22) Filed: Sep. 6, 2013

(65) Prior Publication Data

US 2014/0009361 A1 Jan. 9, 2014

Related U.S. Application Data

(63) Continuation of application No. PCT/JP2012/055505, filed on Mar. 5, 2012.

(30) Foreign Application Priority Data

Mar. 8, 2011 (JP) .................. 2011-050547

(51) Int. Cl.
| | |
|---|---|
| *H01Q 1/50* | (2006.01) |
| *H01Q 1/24* | (2006.01) |
| *H01Q 5/00* | (2006.01) |
| *H01Q 9/42* | (2006.01) |
| *H01Q 9/40* | (2006.01) |

(52) U.S. Cl.
CPC ............... *H01Q 1/50* (2013.01); *H01Q 5/0058* (2013.01); *H01Q 5/0051* (2013.01); *H01Q 9/42* (2013.01); *H01Q 9/40* (2013.01); *H01Q 1/243* (2013.01)
USPC .......................................... 343/860; 343/702

(58) Field of Classification Search
USPC ................................... 343/850, 860, 702, 725
See application file for complete search history.

(56) References Cited

U.S. PATENT DOCUMENTS

| | | | |
|---|---|---|---|
| 3,364,564 | A | 1/1968 | Kurtz et al. |
| 4,794,397 | A | 12/1988 | Ohe et al. |

(Continued)

FOREIGN PATENT DOCUMENTS

| | | |
|---|---|---|
| DE | 10 2006 057 369 A1 | 6/2008 |
| EP | 0 694 874 A2 | 1/1996 |

(Continued)

OTHER PUBLICATIONS

Official communication issued in counterpart European Application No. 08 77 7758, dated on Jun. 30, 2009.

(Continued)

*Primary Examiner* — Hoang V Nguyen
(74) *Attorney, Agent, or Firm* — Keating & Bennett, LLP

(57) ABSTRACT

An antenna device includes a plate-shaped radiating element, a frame-shaped radiating element arranged to surround the plate-shaped radiating element, and a feeding unit that includes a feeding circuit and a frequency stabilizing circuit and that is connected between the plate-shaped radiating element and the frame-shaped radiating element. The plate-shaped radiating element and the frame-shaped radiating element are connected to the feeding circuit through the frequency stabilizing circuit as a result of a first terminal portion of the frequency stabilizing circuit being connected to the frame-shaped radiating element, a second terminal portion of the frequency stabilizing circuit being connected to the plate-shaped radiating element, and a third terminal portion of the frequency stabilizing circuit being connected to the feeding circuit.

16 Claims, 21 Drawing Sheets

(56) References Cited

U.S. PATENT DOCUMENTS

| | | |
|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,289,064 B2 * | 10/2007 | Cheng .................... 343/700 MS |
| 7,317,396 B2 | 1/2008 | Ujino |
| 7,405,664 B2 | 7/2008 | Sakama et al. |
| 7,710,325 B2 * | 5/2010 | Cheng .................... 343/700 MS |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0186004 A1 | 12/2002 | Prazeres da Costa et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2003/0206095 A1 | 11/2003 | Chaloner et al. |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0074268 A1 | 3/2008 | Shafer |
| 2008/0087990 A1 | 4/2008 | Kato et al. |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0008460 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0134979 A1 | 5/2009 | Tsukamoto et al. |
| 2009/0140947 A1 | 6/2009 | Sasagawa et al. |
| 2009/0153404 A1 * | 6/2009 | Ryou et al. ............. 343/700 MS |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0284220 A1 | 11/2009 | Toncich et al. |
| 2010/0103058 A1 | 4/2010 | Kato et al. |

(56) References Cited

U.S. PATENT DOCUMENTS

| | | |
|---|---|---|
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0080331 A1 | 4/2011 | Kato |
| 2011/0186641 A1 | 8/2011 | Kato et al. |
| 2011/0253795 A1 | 10/2011 | Kato |
| 2012/0001701 A1 | 1/2012 | Taniguchi et al. |

FOREIGN PATENT DOCUMENTS

| | | |
|---|---|---|
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| GB | 2470299 A | 11/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-069533 A | 3/1998 |
| JP | 10-69533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |

(56) References Cited

FOREIGN PATENT DOCUMENTS

| | | |
|---|---|---|
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-325013 A | 11/2002 |
| JP | 2002-362613 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |
| JP | 2004-126750 A | 4/2004 |
| JP | 2004-127230 A | 4/2004 |
| JP | 2004-145449 A | 5/2004 |
| JP | 2004-163134 A | 6/2004 |
| JP | 2004-166176 A | 6/2004 |
| JP | 2004-172919 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |

(56) References Cited

FOREIGN PATENT DOCUMENTS

| | | |
|---|---|---|
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-028002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-252517 A | 10/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-065426 A | 3/2009 |

(56) References Cited

FOREIGN PATENT DOCUMENTS

| | | |
|---|---|---|
| JP | 2009-110144 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-278441 A | 11/2009 |
| JP | 2009-284182 A | 12/2009 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-074839 A | 4/2010 |
| JP | 2010-081571 | 4/2010 |
| JP | 4535209 B2 | 9/2010 |
| JP | 4561932 B2 | 10/2010 |
| JP | 2010-268306 A | 11/2010 |
| JP | 2011-015395 A | 1/2011 |
| JP | 4609604 B2 | 1/2011 |
| JP | 2011-076567 A | 4/2011 |
| JP | 2011-205384 A | 10/2011 |
| JP | 2012-033021 A | 2/2012 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 01/95242 A2 | 12/2001 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

OTHER PUBLICATIONS

Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599; filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2012/050557, mailed on Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.

(56) References Cited

OTHER PUBLICATIONS

Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Appl. No. 13/848,748, filed Mar. 22, 2013.
Official Communication issued in International Patent Application No. PCT/JP2012/080493, mailed on Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, mailed on Jan. 15, 2013.
Mukai et al.: "Wireless Integrated Circuit Device and Method of Manufacturing the Same"; U.S. Appl. No. 13/961,995, filed Aug. 8, 2013.
Kato et al.: "Radio IC Device"; U.S. Appl. No. 13/964,234, filed Aug. 12, 2013.
Official Communication issued in International Patent Application No. PCT/JP2012/067779, mailed on Aug. 28, 2012.
Official Communication issued in International Patent Application No. PCT/JP2013/051254, mailed on Apr. 2, 2013.
Dokai: "Wireless Communication Device"; U.S. Appl. No. 13/970,633, filed Aug. 20, 2013.
Official Communication issued in International Patent Application No. PCT/JP2012/059350, mailed on Jul. 3, 2012.
Dokai: "Wireless IC Device"; U.S. Appl. No. 14/011,823, filed Aug. 28, 2013.
Official Communication issued in International Patent Application No. PCT/JP2012/055505, mailed on Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.

Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.

(56) References Cited

OTHER PUBLICATIONS

Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al,: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.

Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP20091053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP20091056698, mailed on Jul. 7, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Application No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.

(56) References Cited

OTHER PUBLICATIONS

Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Application No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Application No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device", U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.

* cited by examiner

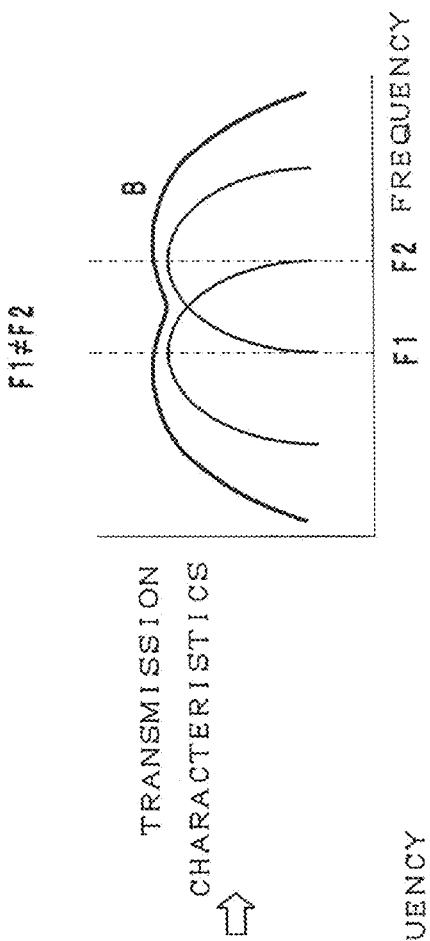
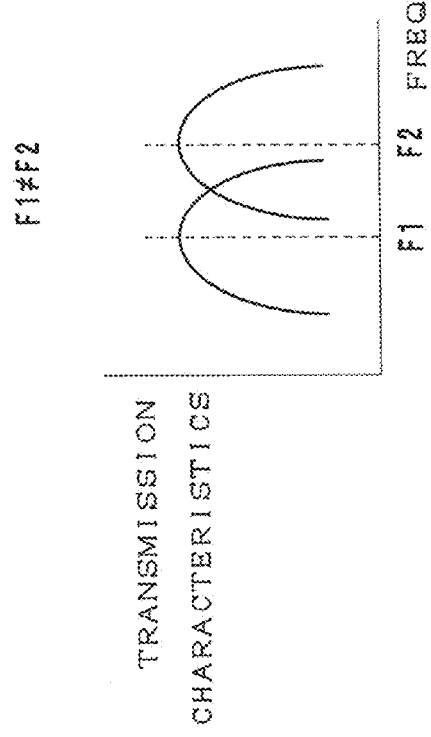

ANTENNA DEVICE AND COMMUNICATION TERMINAL APPARATUS

BACKGROUND OF THE INVENTION

1. Field of the Invention

The present invention relates to antenna devices, and particularly to antenna devices mounted in mobile communication terminal apparatuses, such as cellular phones, and to communication terminal apparatuses.

2. Description of the Related Art

Recently, as antenna devices mounted in mobile communication terminal apparatuses, casing dipole antennas have been proposed in which a metal body (for example, a ground plate of a printed wiring board) arranged within a terminal casing is used as a radiating element, as disclosed in Japanese Unexamined Patent Application Publication No. 2004-172919, Japanese Unexamined Patent Application Publication No. 2005-6096, and Japanese Unexamined Patent Application Publication No. 2008-118359. In a dipole antenna of this type, performance similar to that of a dipole antenna can be obtained by means of differential feeding for two casing ground plates (ground plate of a main body casing and a ground plate of a cover casing) in a folding-type or slide-type mobile communication terminal. Further, since the ground plates arranged in the casings are used as radiating elements, there is no need to provide separate dedicated radiating elements, resulting in a reduction in the size of mobile communication terminal apparatuses.

However, in the dipole antenna described above, the impedances of the ground plates vary in accordance with the shapes of the ground plates, the shapes of the casings, and states in which nearby metal objects (for example, nearby electronic components and hinge components) are arranged. Hence, to reduce the energy loss of a high-frequency signal, it is necessary to design an impedance matching circuit for each type of apparatus. Further, in a folding-type or slide-type mobile communication terminal apparatus there is a problem in that the impedances of ground plates and an impedance matching circuit vary in accordance with the positional relationship between the main body casing and the cover casing (for example, a state in which the cover is closed or a state in which the cover is open in a folding-type apparatus) and it is difficult to obtain a high gain in a state in which the casing is closed.

SUMMARY OF THE INVENTION

Accordingly, preferred embodiments of the present invention provide an antenna device and a communication terminal apparatus which have a high gain and are not influenced by the shapes of a radiating element and a casing, a state in which nearby components are arranged, and the like.

An antenna device according to a first preferred embodiment of the present invention includes: a plate-shaped radiating element; a frame-shaped radiating element arranged to surround the plate-shaped radiating element; and a feeding unit that includes a feeding circuit and a frequency stabilizing circuit and that is connected between the plate-shaped radiating element and the frame-shaped radiating element.

The plate-shaped radiating element and the frame-shaped radiating element are connected to the feeding circuit through the frequency stabilizing circuit as a result of a first terminal portion of the frequency stabilizing circuit being connected to the frame-shaped radiating element, a second terminal portion of the frequency stabilizing circuit being connected to the plate-shaped radiating element, and a third terminal portion of the frequency stabilizing circuit being connected to the feeding circuit.

A communication terminal apparatus according to a second preferred embodiment of the present invention includes: a plate-shaped radiating element arranged within a casing; a frame-shaped radiating element arranged along an inner side surface or an outer side surface of the casing to surround the plate-shaped radiating element; and a feeding unit that includes a feeding circuit and a frequency stabilizing circuit and that is connected between the plate-shaped radiating element and the frame-shaped radiating element.

The plate-shaped radiating element and the frame-shaped radiating element are connected to the feeding circuit through the frequency stabilizing circuit as a result of a first terminal portion of the frequency stabilizing circuit being connected to the frame-shaped radiating element, a second terminal portion of the frequency stabilizing circuit being connected to the plate-shaped radiating element, and a third terminal portion of the frequency stabilizing circuit being connected to the feeding circuit.

In the antenna device, a dipole antenna is provided for the feeding unit such that the plate-shaped radiating element functions as a first radiating element and the frame-shaped radiating element functions as a second radiating element. Hence, the effective antenna area of the frame-shaped radiating element is increased while reducing or preventing capacitive coupling between the plate-shaped radiating element and the frame-shaped radiating element, such that the gain is increased.

According to various preferred embodiments of the present invention, since a dipole antenna is provided for the feeding unit such that the plate-shaped radiating element functions as a first radiating element and the frame-shaped radiating element functions as a second radiating element, the frequency of a high-frequency signal is stabilized and the gain is increased, without being influenced by the shapes of the radiating elements and the casing, states in which nearby components are arranged, and the like.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a schematic perspective view of the internal configuration of the communication terminal apparatus and FIG. 1B is a schematic plan view.

FIG. 2A is a plan view and FIG. 2B is a perspective view.

FIG. 4A is a schematic perspective diagram and FIG. 4B is a schematic plan view.

FIG. 9A is an equivalent circuit diagram, FIG. 9B is an operating principle diagram, and FIG. 9C is a circuit diagram illustrated from the view point of a filter.

FIGS. 10A to 10D are graphs illustrating the transmission characteristics of the antenna device using the first example of the frequency stabilizing circuit.

FIG. 11A is a perspective view of the front surface side and FIG. 11B is a perspective view of the back surface side.

FIG. 23A is an equivalent circuit diagram and FIG. 23B is a diagram illustrating the operations.

DETAILED DESCRIPTION OF THE PREFERRED EMBODIMENTS

Figure 1A:
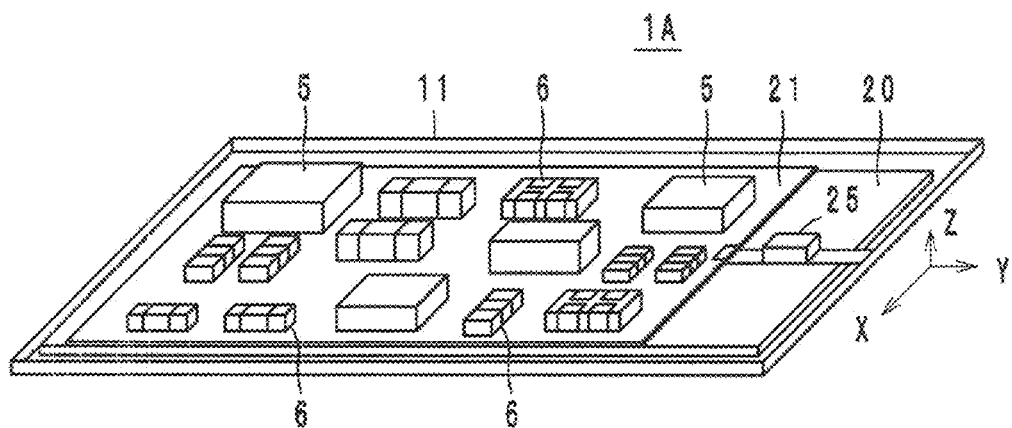
FIGS. 1A and 1B illustrate a first preferred embodiment of a communication terminal apparatus, where
Figure 1B:
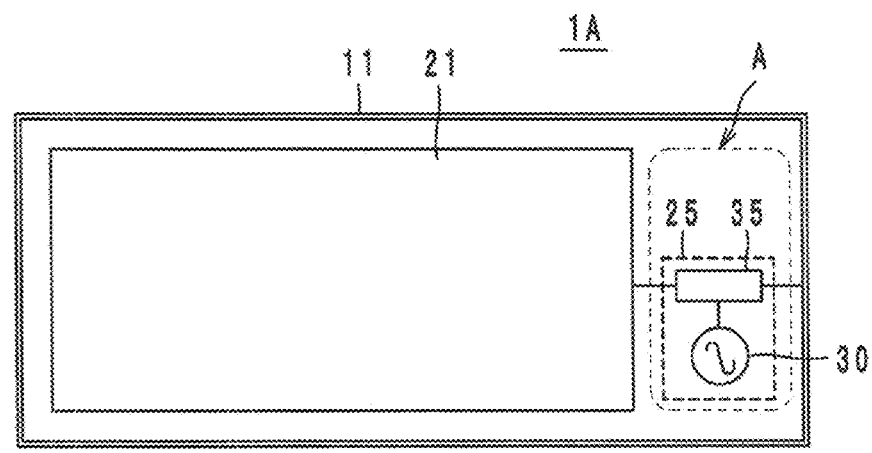
Figure 2A:
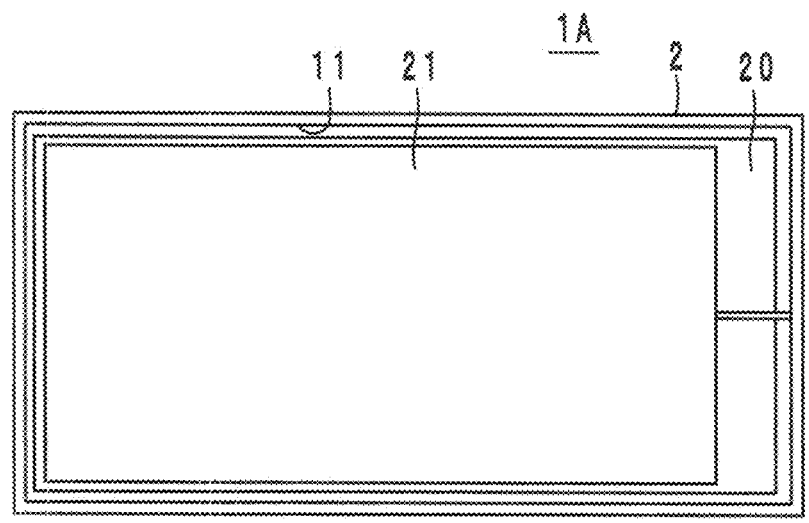
FIGS. 2A and 2B illustrate the positional relationship between radiation elements and a casing in the first preferred embodiment of the communication terminal apparatus, where
Figure 2B:
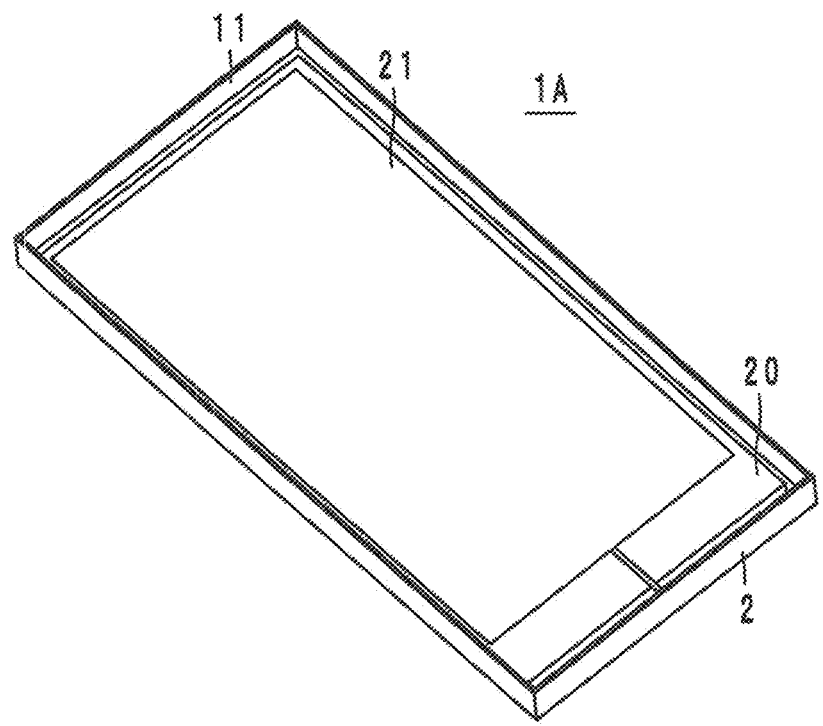

Hereinafter, preferred embodiments of an antenna device and a communication terminal apparatus according to the present invention will be described with reference to the attached drawings. Note that components, members, and portions common in the figures are denoted by the same reference symbols, and duplicate descriptions thereof are omitted.
First Preferred Embodiment A mobile communication terminal apparatus 1A, which preferably is a terminal for 1 Seg (Japanese terrestrial digital TV broadcasting for mobile apparatuses) reception (470 MHz to 770 MHz), for example, includes an antenna device including a plate-shaped radiating element 21 which is arranged on a printed wiring board 20 provided inside a first casing 2 and which functions as a ground electrode, a frame-shaped radiating element 11 arranged along the inner surface of the first casing 2 to surround the plate-shaped radiating element 21, and a feeding unit 25 connected between the plate-shaped radiating element 21 and the frame-shaped radiating element 11, as illustrated in FIGS. 1A and 1B and FIGS. 2A and 2B. The feeding unit 25 includes a feeding circuit 30 that processes a wireless signal and a frequency stabilizing circuit 35 described in detail later. The plate-shaped radiating element 21 and the frame-shaped radiating element 11 are connected to the feeding circuit 30 through the frequency stabilizing circuit 35 (refer to FIG. 1B).

Note that the mobile communication terminal apparatus 1A includes a second casing (not illustrated) functioning as a cover member in addition to the first casing 2. The second casing is connected to the first casing 2 in a folding manner or sliding manner (refer to FIG. 1B). Many components, such as IC circuit components 5 and chip-type electronic components 6, required for a communication terminal apparatus are mounted on the printed wiring board 20.

The plate-shaped radiating element 21 and the frame-shaped radiating element 11 can include conductor films made of thin films such as metal foils and metal evaporated films or thick films such as ones including conductive paste, for example. The frame-shaped radiating element 11 may be made of a line member, for example. Note that a metal back cover of the first casing 2 or a metal coating film of a battery housed in the first casing 2 may be used as the plate-shaped radiating element 21, rather than providing the plate-shaped radiating element 21 on the printed wiring board 20.

Figure 3:
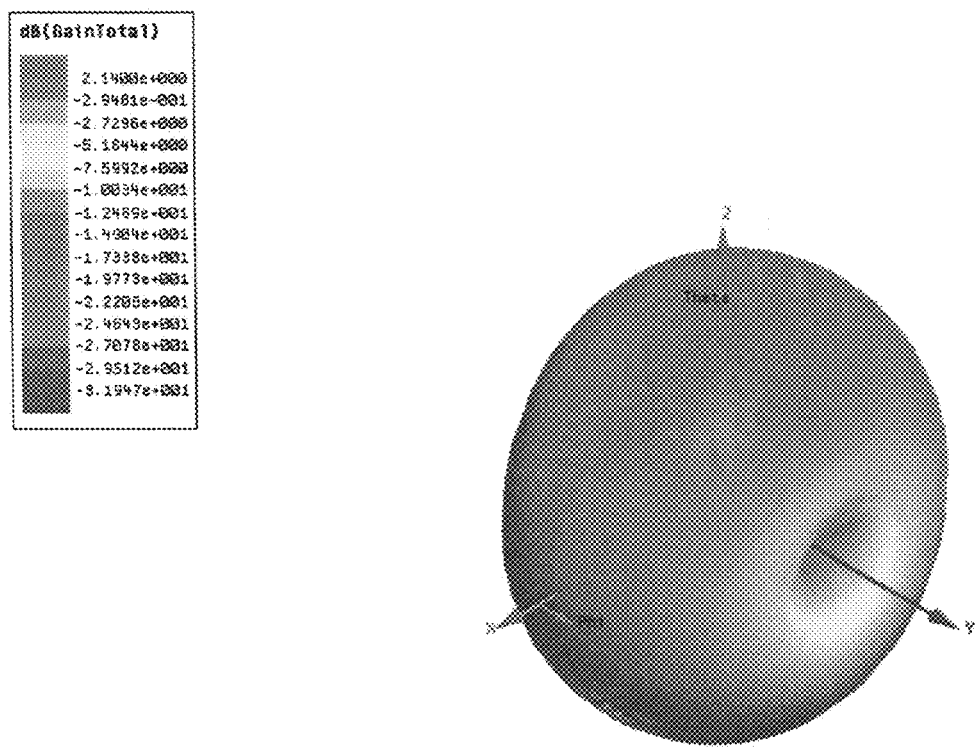
FIG. 3 is a schematic diagram illustrating the strength of a radiation electric field in an antenna device mounted in the first preferred embodiment of the communication terminal apparatus.

The plate-shaped radiating element 21 and the frame-shaped radiating element 11 exhibit a performance about the same as that of a dipole antenna as a result of being fed by the feeding circuit 30 in a differential manner through the frequency stabilizing circuit 35. The feeding circuit 30 includes a signal processing circuit, such as an RF circuit and a BB circuit and preferably is a semiconductor integrated circuit, for example. In other words, in this antenna device, a dipole antenna is provided for the feeding unit 25 such that the plate-shaped radiating element 21 functions as a first radiating element and the frame-shaped radiating element 11 functions as a second radiating element which includes the center of the first radiating element and includes a space portion A in at least a portion of the frame-shaped radiating element 11. Hence, the frame-shaped radiating element 11 functions as an antenna while the plate-shaped radiating element 21 and the frame-shaped radiating element 11 are capacitively coupled to each other. When a cellular phone is configured to have this antenna shape, the plate-shaped radiating element 21 cannot be touched by hand. As a result, when the frame-shaped radiating element 11 is arranged at the most peripheral portion of the cellular phone, even if a human body touches the frame-shaped radiating element 11, there is no change in the capacitive coupling between the plate-shaped radiating element 21 and the frame-shaped radiating element 11 and, hence, stable antenna characteristics are exhibited. In this antenna device, the strength of a radiation electric field schematically illustrated in FIG. 3 is obtained. The arrows X, Y, and Z in FIG. 3 correspond to the arrows X, Y, and Z in FIG. 1A for the 850 MHz band, for example. That is, a sufficient gain is obtained in all the directions X, Y, and Z, although the gain in the Y direction is relatively small. Note that the gain in the 2 GHz band, in particular, is sufficiently large in all the directions X, Y, and Z, although not illustrated.

The frequency stabilizing circuit 35, which is provided between the feeding circuit 30 and the radiating elements 21 and 11, stabilizes a high-frequency signal transmitted from the plate-shaped radiating elements 21 and 11 or a high-frequency signal received at the radiating elements 21 and 11. Hence, the frequency characteristics of high-frequency signals are stabilized without being influenced by the shapes of the radiating elements 21 and 11, the shape of the first casing 2, states in which nearby components are arranged, and the like. Particularly in folding-type or slide-type mobile communication terminal apparatuses, although the impedances of the radiating elements 21 and 11 are likely to change in accordance with the open/closed states of the casing, the frequency characteristics of high-frequency signals are stabilized by providing the frequency stabilizing circuit 35. The details of the frequency stabilizing circuit 35 will be described below with reference to FIG. 9A to FIG. 23B.

Second Preferred Embodiment

Figure 4A:
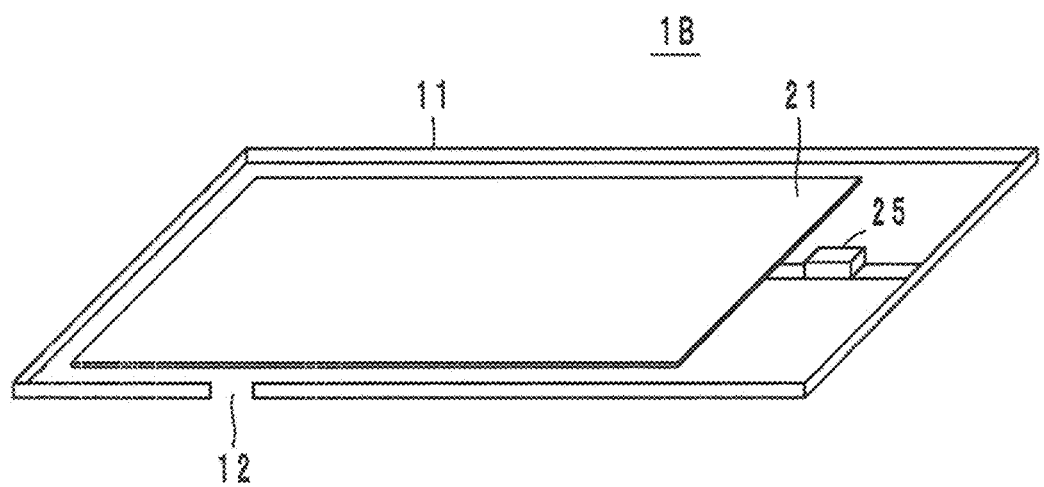
FIGS. 4A and 4B illustrate a second preferred embodiment of the communication terminal apparatus, where
Figure 4B:
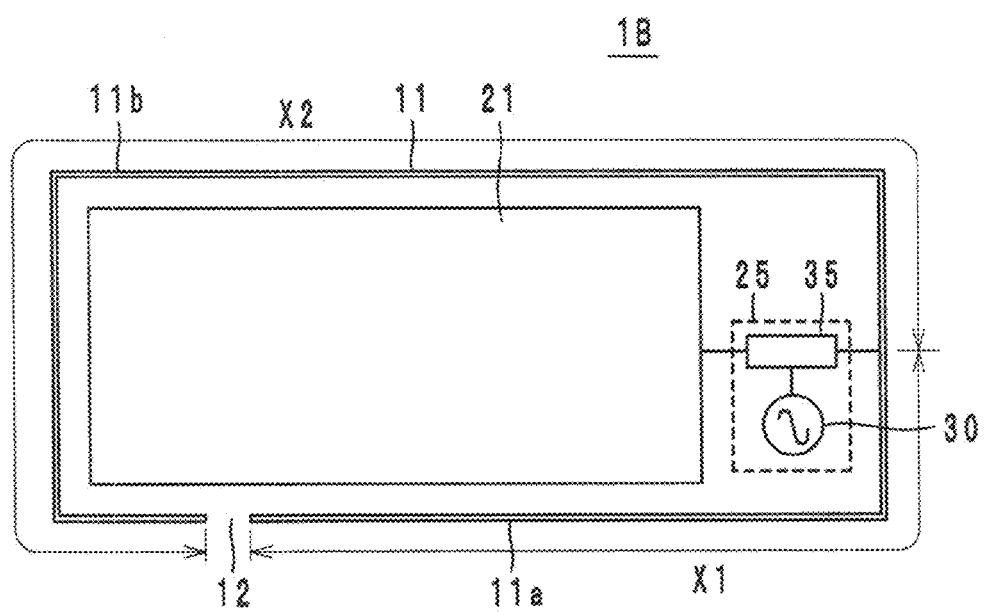

Referring to FIG. 4B, a mobile communication terminal apparatus 1B has a configuration in which a portion of a frame-shaped radiating element 11 is cut out as a gap 12. The rest of the configuration is similar to that of the first preferred embodiment described above. A potential difference is generated between the opposing end portions across the gap 12, such that the strength of an electric field at the opposing end portions is increased. Hence, the directivity of the antenna can be controlled by adjusting the position of the gap 12. Further, by dividing the frame-shaped radiating element 11 into a radiating portion 11a having a relatively short line length of X1 and a radiating portion 11b having a relatively long line length of X2, the radiating portion 11a can be made to correspond to a high-band side frequency band and the radiating portions 11a and 11b (line length of X1+X2) can be made to correspond to a low-band side frequency band in accordance with the frequency bands used. The rest of the operations and effects of the second preferred embodiment are similar to those of the first preferred embodiment.

Third Preferred Embodiment

Figure 5:
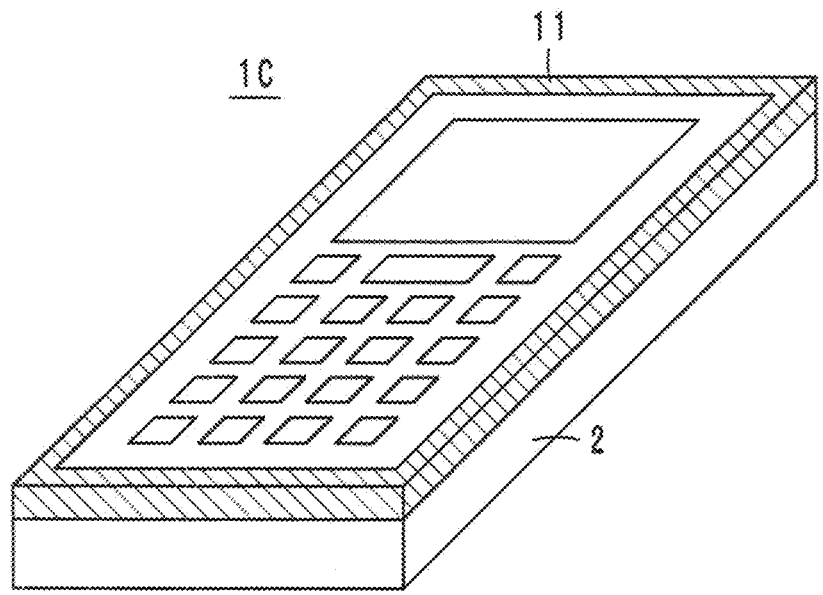
FIG. 5 is a perspective view of a third preferred embodiment of the communication terminal apparatus.

Referring to FIG. 5, a mobile communication terminal apparatus 1C has a configuration in which a frame-shaped radiating element 11 is arranged to surround the top edge portion of the external surface of a first casing 2 as indicated by shading. The rest of the configuration and also the operations and effects of the third preferred embodiment are similar to those of the first preferred embodiment.

Fourth Preferred Embodiment

Figure 6:
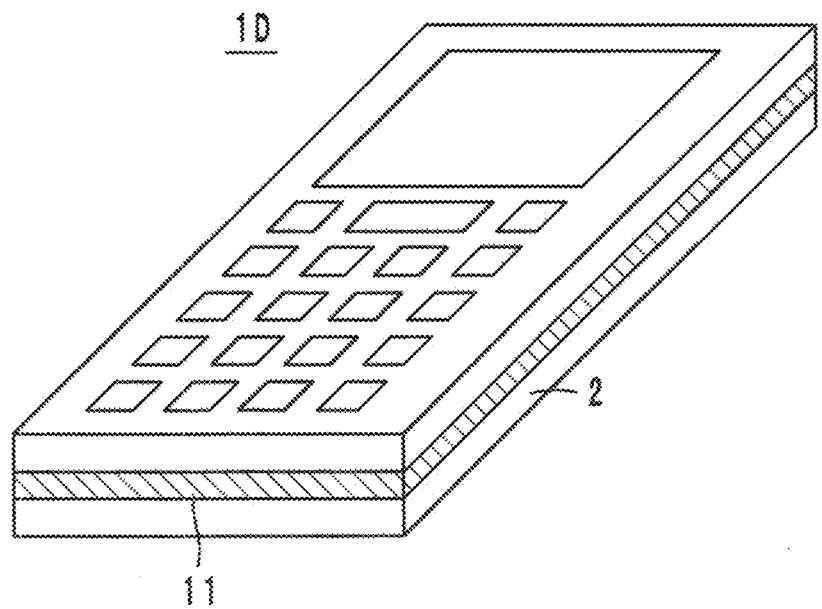
FIG. 6 is a perspective view of a fourth preferred embodiment of the communication terminal apparatus.

Referring to FIG. 6, a mobile communication terminal apparatus 1D has a configuration in which a frame-shaped radiating element 11 is arranged to cover the middle portions of the external side surfaces of a first casing 2 as indicated by shading. The rest of the configuration and also the operations and effects of the fourth preferred embodiment are similar to those of the first preferred embodiment.

Fifth Preferred Embodiment

Figure 7:
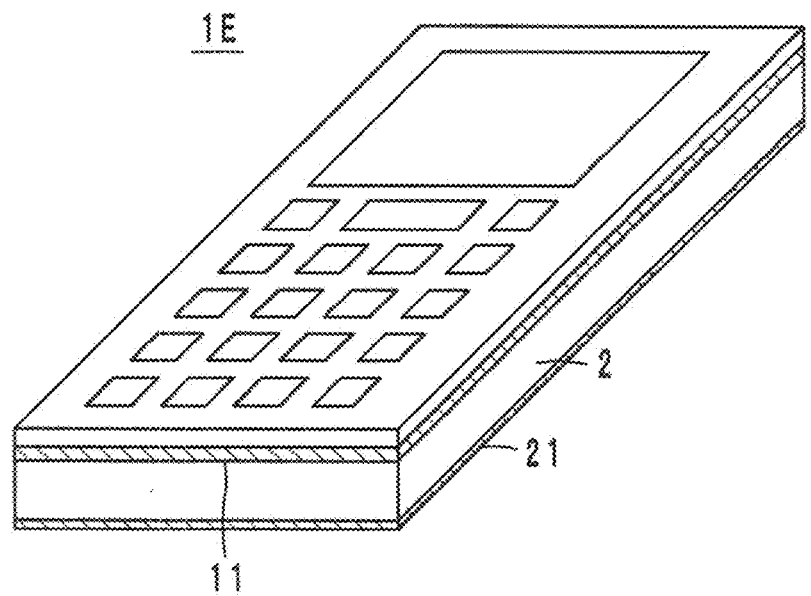
FIG. 7 is a perspective view of a fifth preferred embodiment of the communication terminal apparatus.

Referring to FIG. 7, a mobile communication terminal apparatus 1E has a configuration in which a plate-shaped radiating element 21 is provided on the whole bottom surface of a first casing 2 as indicated by shading, and a frame-shaped radiating element 11 is arranged to cover the upper portions of the external side surfaces of the first casing 2 as indicated by shading. The rest of the configuration and also the operations and effects of the fifth preferred embodiment are similar to those of the first preferred embodiment.

Sixth Preferred Embodiment

Figure 8:
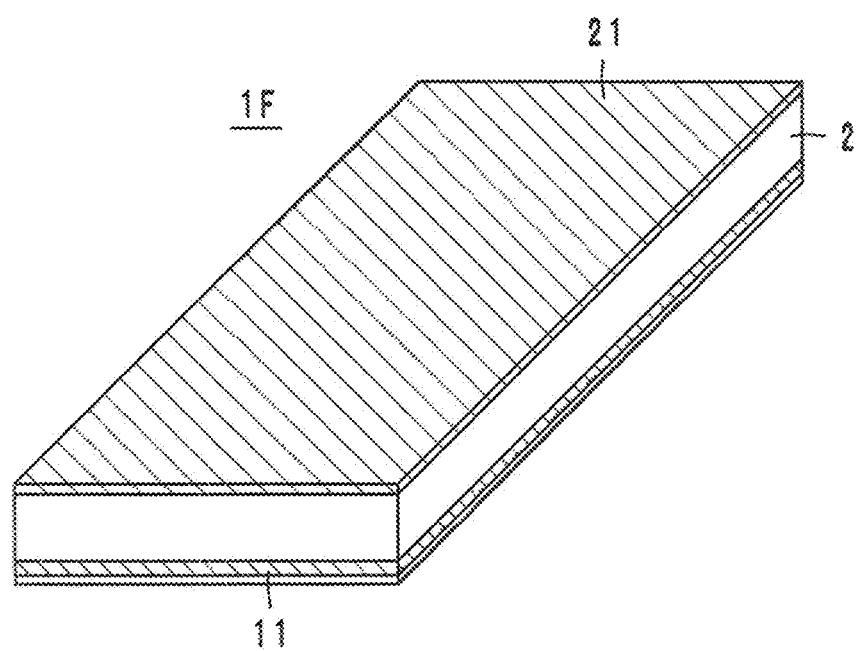
FIG. 8 is a perspective view of a sixth preferred embodiment of the communication terminal apparatus.

Referring to FIG. 8, a mobile communication terminal apparatus 1F has a configuration in which a plate-shaped radiating element 21 is provided on the whole top surface of a first casing 2 as indicated by shading, and a frame-shaped radiating element 11 is arranged to cover the lower portions of the external side surfaces of the first casing 2 as indicated by shading. The rest of the configuration and also the operations and effects of the sixth preferred embodiment are similar to those of the first preferred embodiment.

First Example of Frequency Stabilizing Circuit

Figure 9A:
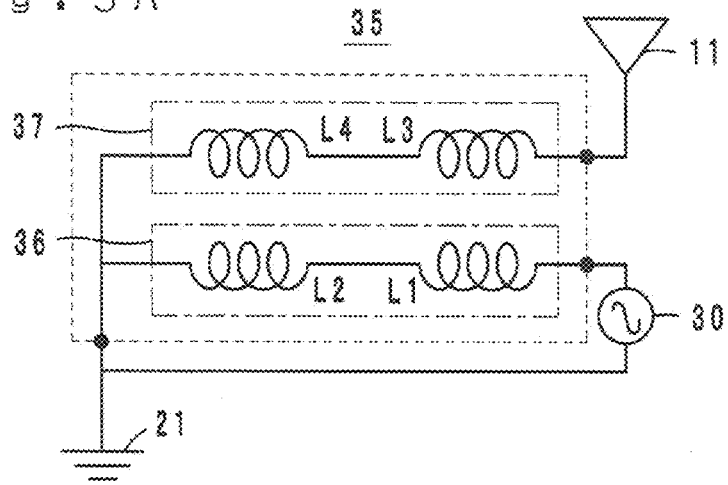
FIGS. 9A, 9B, and 9C illustrate a first example of a frequency stabilizing circuit, where

Referring to FIG. 9A, a frequency stabilizing circuit (also called a stabilizer circuit) 35 used in the antenna devices includes a primary side reactance circuit connected to the feeding circuit 30 and a secondary side reactance circuit coupled to the primary side reactance circuit through an electric field or a magnetic field. The primary side reactance circuit includes a primary side series circuit 36 including a first reactance element and a second reactance element connected in series to the first reactance element. The secondary side reactance circuit includes a secondary side series circuit 37 including a third reactance element coupled to the first reactance element and a fourth reactance element connected in series with the third reactance element and coupled to the second reactance element. Specifically, the first reactance element includes a first inductance element L1, the second reactance element includes a second inductance element L2, the third reactance element includes a third inductance element L3, and the fourth reactance element includes a fourth inductance element L4.

One end of the primary side series circuit 36 (a first end of the first inductance element L1) is connected to the feeding circuit 30, and one end of the secondary side series circuit 37 (a first end of the third inductance element L3) is connected to the frame-shaped radiating element 11. The other end of the primary side series circuit 36 (a second end of the second inductance element L2) and the other end of the secondary side series circuit 37 (a second end of the fourth inductance element L4) are connected to the plate-shaped radiating element 21.

Figure 9B:
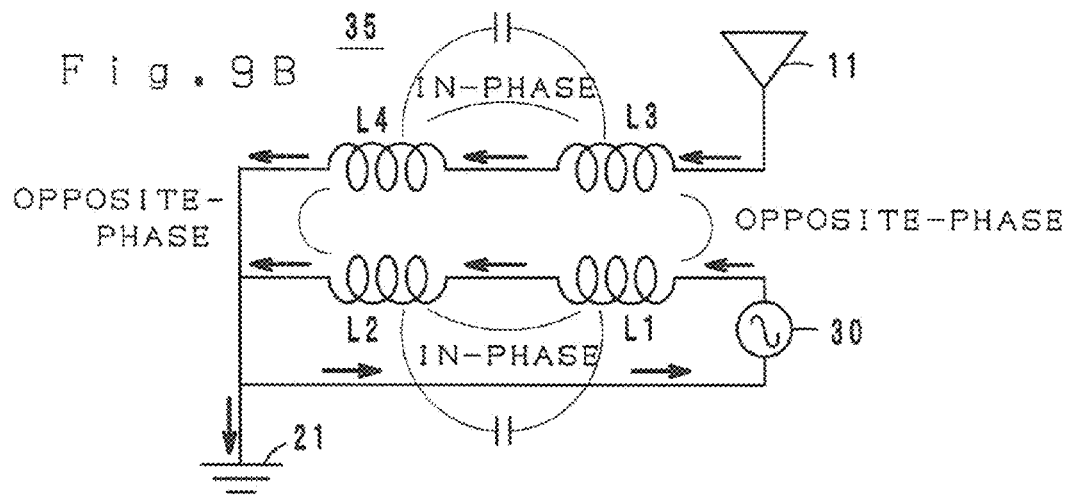

Referring to FIG. 9B, the first inductance element L1 and the second inductance element L2 are coupled to each other through a magnetic field and an electric field in an in-phase mode, and the third inductance element L3 and the fourth inductance element L4 are coupled to each other through a magnetic field and an electric field in an in-phase mode. In other words, pattern wiring is arranged such that a closed magnetic path is defined by the first and second inductance elements L1 and L2, these first and second inductance elements L1 and L2 are mainly coupled through an electromagnetic field, and the direction of a current flowing due to magnetic field coupling is the same as the direction of a current flowing due to electric field coupling. Similarly, pattern wiring is arranged such that a closed magnetic path is defined by the third and fourth inductance elements L3 and L4, these third and fourth inductance elements L3 and L4 are mainly coupled through an electromagnetic field, and the direction of a current flowing due to magnetic field coupling is the same as the direction of a current flowing due to electric field coupling. Further, pattern wiring is arranged such that the first and third inductance elements L1 and L3 are coupled to each other in an opposite-phase mode, and the direction of a current flowing due to magnetic field coupling is the same as the direction of a current flowing due to electric field coupling. Similarly, pattern wiring is arranged such that the second and fourth inductance elements L2 and L4 are coupled to each other in an opposite-phase mode and the direction of a current flowing due to magnetic field coupling is the same as the direction of a current flowing due to electric field coupling. In other words, the first and third inductance elements L1 and L3 and the second and fourth inductance elements L2 and L4 respectively define closed magnetic paths, and these closed magnetic paths, i.e., the primary side series circuit 36 and the secondary side series circuit 37 are coupled to each other mainly through an electromagnetic field. Since the electric field coupling and the electromagnetic field coupling cause respective currents to flow in the same direction, strong electromagnetic field coupling is obtained compared with coupling due to only a magnetic field or coupling due to only an electric field. Note that "coupling through an electromagnetic field" refers to coupling through an electric field, coupling through a magnetic field, or coupling through both an electric field and a magnetic field.

In the frequency stabilizing circuit 35 having the above configuration, a high-frequency current flowing into the primary side series circuit 36 from the feeding circuit 30 flows through the first inductance element L1, and flows through the third inductance element L3 as a secondary current through an induced magnetic field when the inductance elements include coil patterns. The high-frequency signal current that flows through the second inductance element L2 flows through the fourth inductance element L4 as a secondary current through an induced magnetic field. As a result, the high-frequency signal currents flow in the directions indicated by the arrows in FIG. 9B.

In other words, in the primary side series circuit 36, since the first inductance element L1 and the second inductance element L2 are connected in series with each other in an in-phase mode, when a current flows through the first inductance element L1 and the second inductance element L2, a closed magnetic path is provided between the first and second inductance elements L1 and L2. Similarly, also in the secondary side series circuit 37, since the third inductance element L3 and the fourth inductance element L4 are connected in series with each other in an in-phase mode, when an induced current due to the closed magnetic path generated in the primary side series circuit 36 flows through the third inductance element L3 and the fourth inductance element L4, a closed magnetic path is provided between the third inductance elements L3 and L4.

Since the first inductance element L1 and the second inductance element L2 define a closed magnetic path as described above, and are coupled to each other in an in-phase mode, the total inductance of the primary side series circuit 36 becomes smaller than the simple sum of the inductance of the first inductance element L1 and the inductance of the second inductance element L2. On the other hand, the first inductance element L1 and the third inductance element L3 are coupled to each other through mutual inductance, and the mutual inductance becomes the sum of the inductance of the first inductance element L1 and the inductance of the third inductance element L3. This is the same with the relationship between the second inductance element L2 and the fourth inductance element L4.

In other words, since the sum of the mutual inductances formed between the primary side series circuit 36 and the secondary side series circuit 37 becomes large relative to the inductance of the primary side series circuit 36 or the secondary side series circuit 37, the degree of coupling between the primary side series circuit 36 and the secondary side series circuit 37 is apparently increased. That is, since magnetic fields in the primary side series circuit 36 and the secondary side series circuit 37 respectively generate closed magnetic paths, the total inductance (=L1+L2−k1L1−k2L2) of the primary side series circuit 36 and the total inductance (=L3+L4−k1L3−k2L4) of the secondary side series circuit 37 are generated, a current in a direction that is the same as the direction of a current (for example, the same as a displacement current) in a direction that cancels out a magnetic field generated in the primary side series circuit 36 flows through the secondary side series circuit 37. Hence, there are almost no leakages of power in the primary side series circuit 36 and the secondary side series circuit 37 and, in addition, since the overall mutual inductance (=k1L1+k1L3+k2L2+k2L4) of the primary side series circuit 36 and the secondary side series circuit 37 becomes larger than the total impedance (=L1+L2−k1L1−k2L2) of the primary side series circuit 36 and the total impedance (=L3+L4−k1L3−k2L4) of the secondary side series circuit 37, the degree of coupling between the primary side series circuit 36 and the secondary side series circuit 37 is increased. As a result, a degree of coupling as high as 0.7 or higher or even 1.0 or higher (degree of coupling of 2.0 for a particular frequency), for example, is obtained as the degree of coupling between the primary side series circuit 36 and the secondary side series circuit 37. Note that k1 is the coupling coefficient between L1 and L3, and k2 is the coupling coefficient between L2 and L4.

In the frequency stabilizing circuit 35, impedance matching with the feeding circuit 30 side is performed mainly by the primary side series circuit 36, and impedance matching with the frame-shaped radiating element 11 side is performed mainly by the secondary side series circuit 37. In other words, the impedance of the primary side series circuit 36 and the impedance of the secondary side series circuit 37 can be independently designed and, hence, impedances can be easily matched.

Figure 9C:
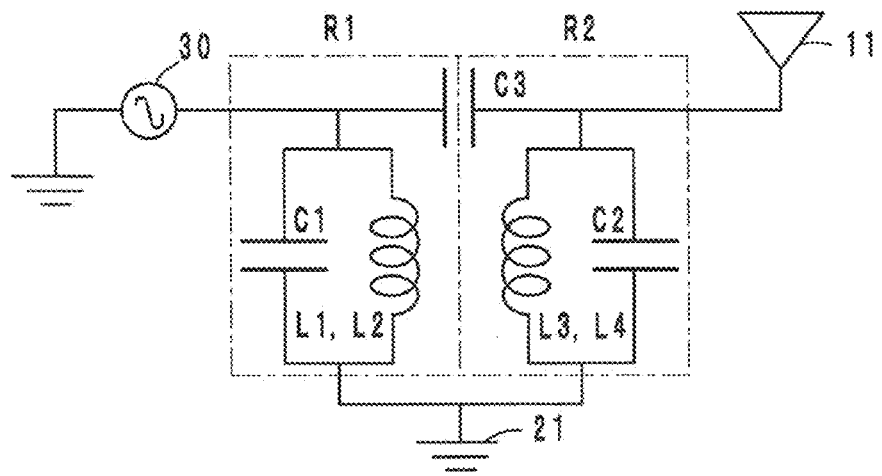

FIG. 9C illustrates, from the viewpoint of a filter, the equivalent circuit illustrated in FIG. 9B. A capacitance element C1 is an inter-line capacitance defined by the first and second inductance elements L1 and L2, a capacitance element C2 is an inter-line capacitance defined by the third and fourth inductance elements L3 and the matching inductor L4. A capacitance element C3 is an inter-line capacitance (parasitic capacitance) defined by the primary side series circuit 36 and the secondary side series circuit 37. In other words, an LC parallel resonant circuit R1 is provided in the primary side series circuit 36 and an LC parallel resonant circuit R2 is provided in the secondary side series circuit 37.

Figure 10A:
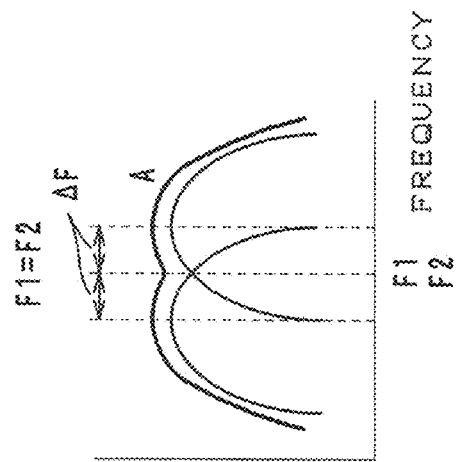
Figure 10B:
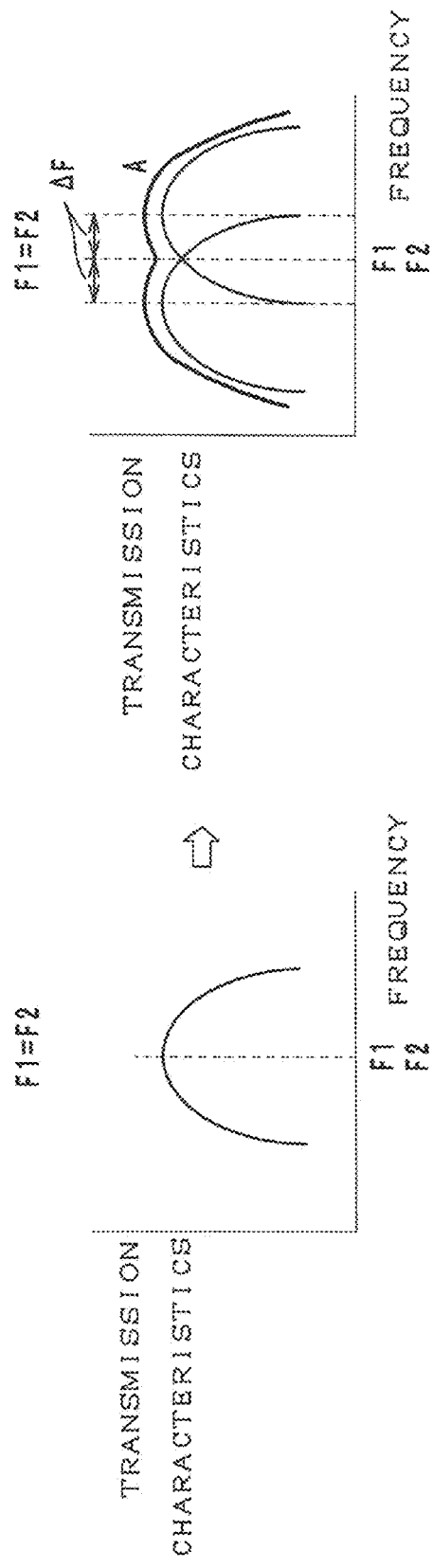

When the resonant frequency in the LC parallel resonant circuit R1 is F1 and the resonant frequency of the LC parallel resonant circuit R2 is F2, a high-frequency signal from the feeding circuit 30 exhibits the transmission characteristics illustrated in FIG. 10A in the case where F1=F2. By respectively coupling the first and second inductance elements L1 and L2 to the third and fourth inductance elements L3 and L4 in an opposite-phase mode, L1+L2 and L3+L4 become small. Hence, the resonant frequencies are not decreased even when the respective inductances of the inductance elements L1 to L4 are increased and, hence, L1 to L4 can be increased. As a result, wide-band transmission characteristics are obtained. Referring to FIG. 10B, for a high-frequency signal from the frame-shaped radiating element 11, wide-band transmission characteristics represented by a curve A are obtained. Although this mechanism is not completely clear, the reason for this is considered to be that degeneration is broken since the LC parallel resonant circuits R1 and R2 are coupled to each other, where ΔF is determined by the degree of coupling between the resonant circuits R1 and R2. In other words, an increase in bandwidth in proportion to the degree of coupling is possible.

On the other hand, in the case where F1≠F2, a high-frequency signal from the feeding circuit 30 exhibits the transmission characteristics illustrated in FIG. 10C. Referring to FIG. 10D, for a high-frequency signal from the frame-shaped radiating element 11, wide-band transmission characteristics represented by a curve B are obtained. Also in this case, the reason for this is considered to be that degeneration is broken since the LC parallel resonant circuits R1 and R2 are coupled to each other. When the degree of coupling between the resonant circuits R1 and R2 is high, wide-band transmission characteristics are obtained.

As described above, since the frequency characteristics in impedance matching, for example, are determined on the basis of resonant characteristics of the frequency stabilizing circuit 35 itself, frequency deviation is unlikely to be generated. Further, by realizing wide-band transmission characteristics, a pass band is assured even when the impedance changes to a certain extent. In other words, the frequency characteristics of transmitted/received high-frequency signals can be stabilized irrespective of the size and shape of a radiating element or the surroundings of the radiating element. In addition, since the frequency stabilizing circuit 35 includes closed magnetic paths, shield patterns may be provided above and below the frequency stabilizing circuit 35. This allows a change in characteristics due to external environment to be further reduced.

Figure 11A:
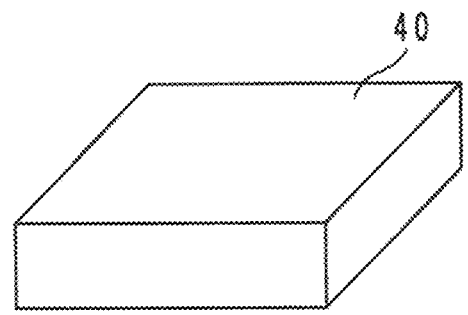
FIGS. 11A and 11B illustrate the frequency stabilizing circuit formed as a multilayer body, where
Figure 11B:
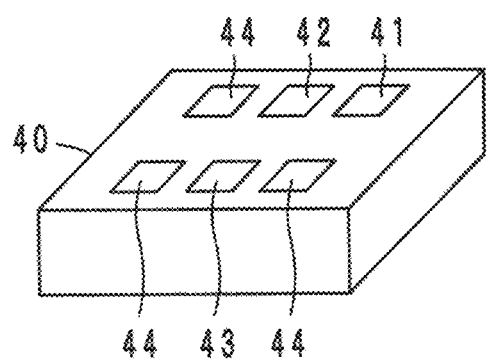

The frequency stabilizing circuit 35 can be a chip-type multilayer body 40 illustrated in FIGS. 11A and 11B which preferably includes a plurality of base material layers, such as dielectric layers or magnetic layers, stacked on each other. On the bottom surface of the multilayer body 40, a feeding terminal 41 connected to the feeding circuit 30, a ground terminal 42 connected to the plate-shaped radiating element 21, and an antenna terminal 43 connected to the frame-shaped radiating element 11 are provided. Other than these terminals, NC terminals 44 used for mounting are provided on the bottom surface. Note that a chip inductor and a chip capacitor to provide impedance matching may be mounted on the top surface of the multilayer body 40, as needed. With this configuration, a wide range of input/output impedance can be realized only by changing the mounted inductor or capacitor. Alternatively, an inductance element and a capacitance element may be provided of electrode patterns within the multilayer body 40.

Here, a first configuration example of the frequency stabilizing circuit 35 within the multilayer body 40 will be described with reference to FIG. 12. In this first configuration example, a conductor 61 is provided on a base material layer 51a, which is the uppermost layer, a conductor 62 which defines portions of the first and second inductance elements L1 and L2 is provided on a base material layer 51b which is the second layer, and two conductors 63 and 64 which respectively define portions of the first and second inductance elements L1 and L2 are provided on a base material layer 51c which is the third layer. Two conductors 65 and 66 which respectively define portions of the third and fourth inductance elements L3 and L4 are provided on a base material layer 51d which is the fourth layer, and a conductor 67 which defines portions of the third and fourth inductance elements L3 and L4 is provided on a base material layer 51e which is the fifth layer. A ground conductor 68 is provided on a base material layer 51f which is the sixth layer and the feeding terminal 41, the ground terminal 42, and the antenna terminal 43 are provided on the bottom surface of a base material layer 51g which is the seventh layer. Note that a plain base material layer is stacked on the uppermost base material layer 51a, although not illustrated.

The conductors 61 to 68 may be made of a conductive material such as silver or copper as a major component. Regarding the base material layers 51a to 51g, dielectric layers may be formed of, for example, a glass ceramic material or an epoxy resin material, and magnetic layers may be made of, for example, a ferrite ceramic material or a resin material containing ferrite. Regarding materials for base material layers, specifically, it is preferable to use a dielectric material to provide a UHF band frequency stabilizing circuit, and it is preferable to use a magnetic material to provide an HF band frequency stabilizing circuit.

By stacking the base material layers 51a to 51g, and appropriately connecting the conductors 61 to 68 and the terminals 41 to 43 to one another through interlayer connection conductors (via hole conductors), an equivalent circuit illustrated in FIG. 9A is provided.

In other words, the feeding terminal 41 is connected to one end of the coil pattern 63 through a via hole conductor 45a, the conductor 61, and a via hole conductor 45b. The other end of the coil pattern 63 is connected to one end of a coil pattern 62a through a via hole conductor 45c. The other end of the coil pattern 62a is connected to one end of a coil pattern 62b and the other end of the coil pattern 62b is connected to one end of the coil pattern 64 through a via hole conductor 45d. The other end of the coil pattern 64 is connected to the ground conductor 68 through a via hole conductor 45e, and the ground conductor 68 is connected to the ground terminal 42 through a via hole conductor 45f. In other words, a first coil pattern, i.e., the first inductance element L1 includes the coil pattern 63 and the coil pattern 62a, and a second coil pattern, i.e., the second inductance element L2 includes the coil pattern 62b and the coil pattern 64.

The antenna terminal 43 is connected to one end of the coil pattern 65 through a via hole conductor 45g, and the other end of the coil pattern 65 is connected to one end of a coil pattern 67a through a via hole conductor 45h. The other end of the coil pattern 67a is connected to one end of a coil pattern 67b and the other end of the coil pattern 67b is connected to one end of the coil pattern 66 through a via hole conductor 45i. The other end of the coil pattern 66 is connected to the ground conductor 68 through a via hole conductor 45j, and the ground conductor 68 is connected to the ground terminal 42 through the via hole conductor 45f. In other words, a third coil pattern, i.e., the third inductance element L3 includes the coil pattern 65 and the coil pattern 67a, and a fourth coil pattern, i.e., the fourth inductance element L4 includes the coil pattern 67b and the coil pattern 66.

Figure 12:
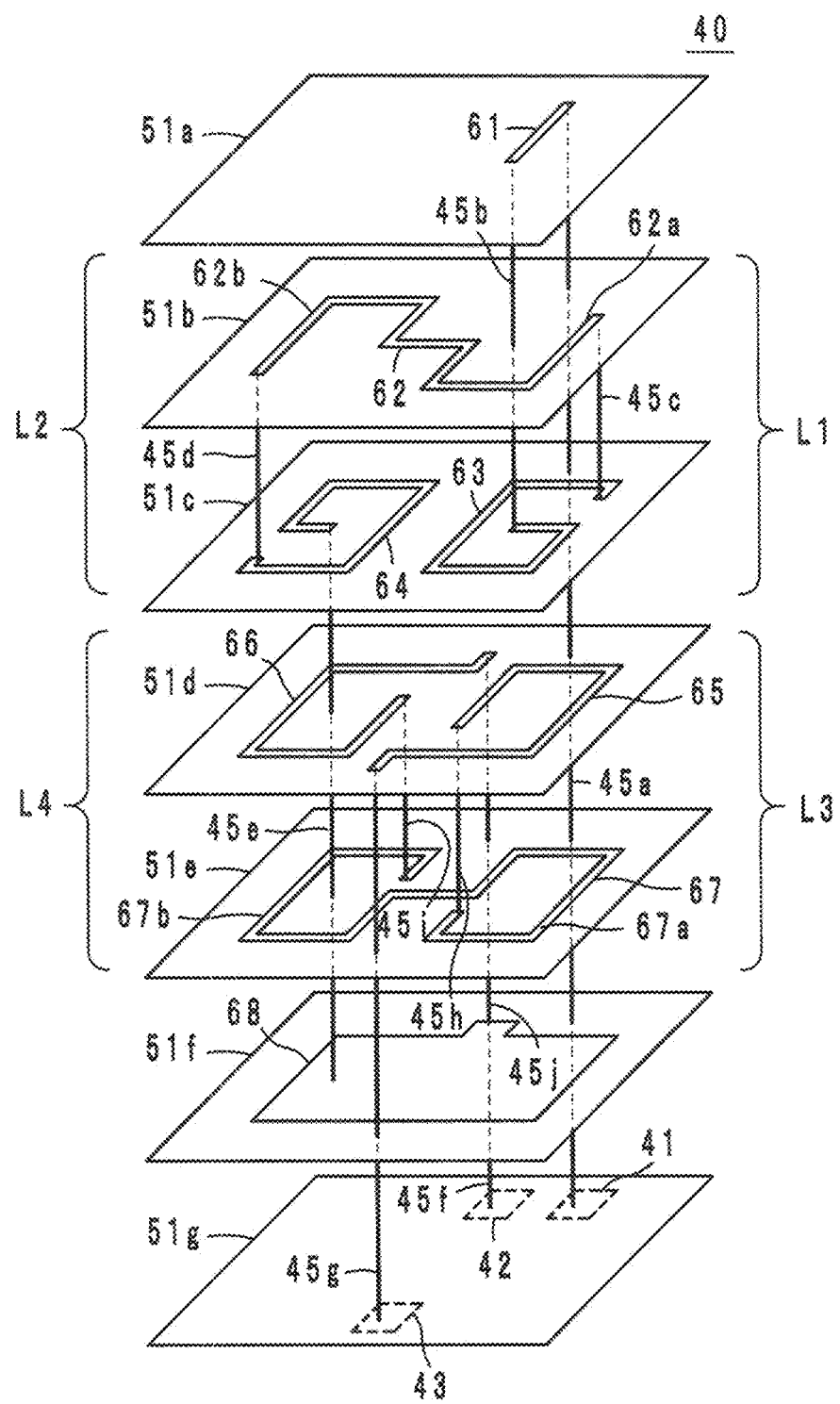
FIG. 12 is an exploded perspective view of a first configuration example of the frequency stabilizing circuit including a multilayer body.

Referring to FIG. 12, the first and second coil patterns are arranged so as to be adjacent to each other such that the winding axis of the first coil pattern is parallel or substantially parallel with the winding axis of the second coil pattern. The third and fourth coil patterns are arranged so as to be adjacent to each other such that the winding axis of the third coil pattern is parallel or substantially parallel with the winding axis of the fourth coil pattern. Further, the first and third coil patterns are arranged such that the winding axis of the first coil pattern and the winding axis of the third coil pattern define a straight line or a substantially straight line, and the second and fourth coil patterns are arranged such that the winding axis of the second coil pattern and the winding axis of the fourth coil pattern define a straight line or a substantially straight line.

Each of the coil patterns, which includes a single-turn loop conductor, may be include a multiple-turn loop conductor. The first and third coil patterns need not be arranged such that the winding axes strictly define a straight line. It is only required that the windings be arranged such that the openings of the first and third coil patterns are superposed with each other in plan view, that is, common magnetic flux passes through the two coil patterns. Similarly, the second and fourth coil patterns need not be arranged such that the winding axes strictly define a straight line. It is only required that the windings be arranged such that the openings of the second and fourth coil patterns are superposed with each other in plan view, that is, common magnetic flux passes through the two coil patterns.

As described above, by housing the inductance elements L1 to L4 within the multilayer body 40 including dielectric layers or magnetic layers, and in particular, by arranging the coupling portion between the primary side series circuit 36 and the secondary side series circuit 37 within the multilayer body 40, the reactance values of the elements that define the frequency stabilizing circuit 35, and further, the degree of coupling between the primary side series circuit 36 and the secondary side series circuit 37 become unlikely to be influenced by other electronic components in the vicinity of the multilayer body 40. As a result, the frequency characteristics are further stabilized.

Various wiring lines are provided on the printed wiring board 20 (refer to FIG. 1A) on which the multilayer body 40 is mounted. These wiring lines may interfere with the frequency stabilizing circuit 35. By arranging the ground conductor 68 on the bottom of the multilayer body 40 to cover the openings of the coil patterns formed of the conductors 61 to 67, as in the first configuration example, a magnetic field generated by the coil patterns becomes unlikely to be influenced by the magnetic fields generated by the various wiring lines on the printed wiring board 20. In other words, variations in the inductances of the inductance elements L1 to L4 become unlikely to occur.

Figure 13:
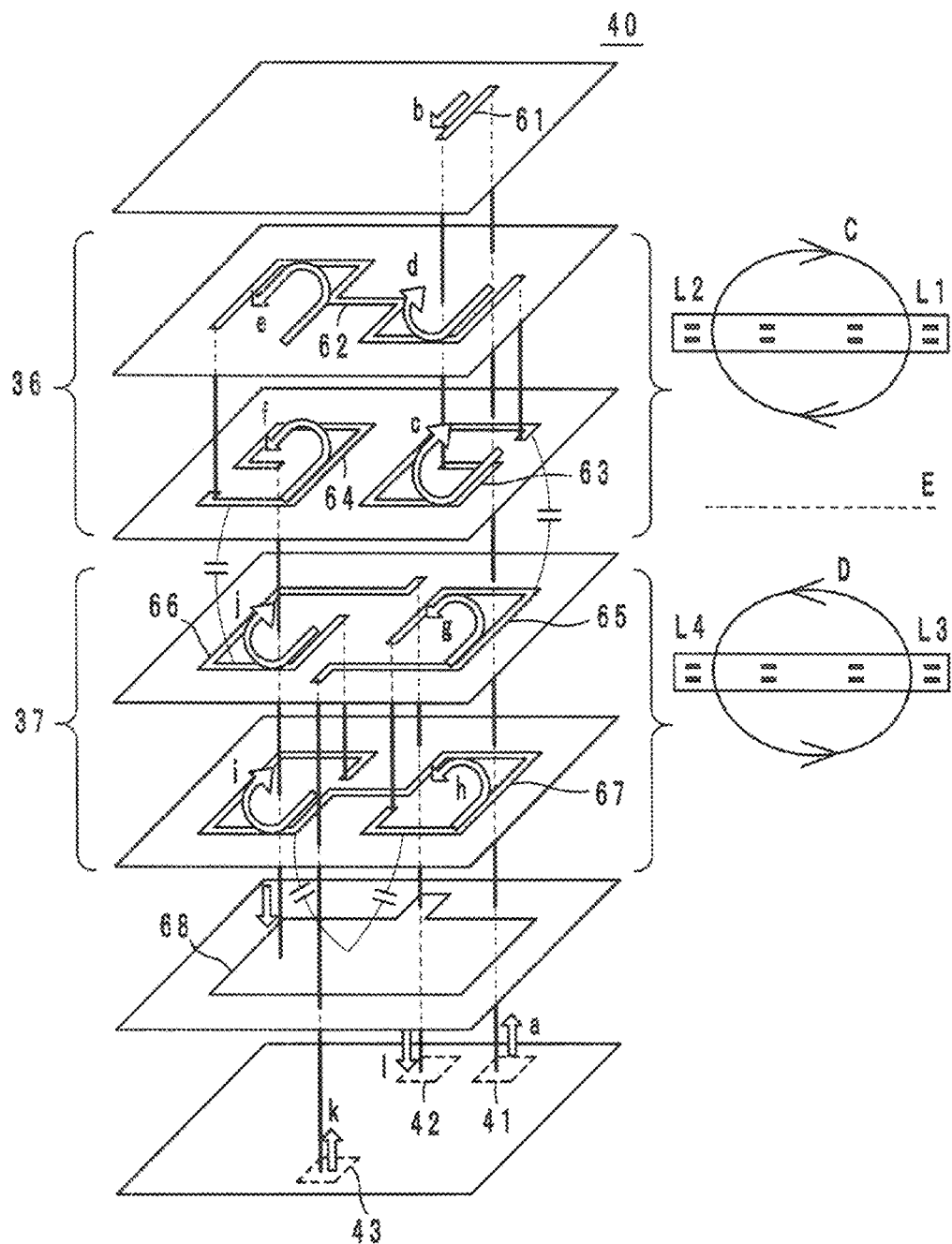
FIG. 13 is a diagram illustrating the operating principle of the frequency stabilizing circuit illustrated in FIG. 12.

Referring to FIG. 13, in the frequency stabilizing circuit 35 which is the first configuration example, a high-frequency signal current received at the feeding terminal 41 flows in directions indicated by arrows a and b, flows through the first inductance element L1 (conductors 62 and 63) as indicated by arrows c and d, and further flows through the second inductance element L2 (conductors 62 and 64) as indicated by arrows e and f. A magnetic field C generated by a primary current (arrows c and d) causes a high-frequency signal current to be excited in the third inductance element L3 (conductors 65 and 67) as indicated by arrows g and h, such that an induced current (secondary current) flows. Similarly, the magnetic field C generated by the primary current (arrows e and f) causes a high-frequency signal current to be excited in the fourth inductance element L4 (conductors 66 and 67) as indicated by arrows i and j, such that an induced current (secondary current) flows.

In other words, the magnetic field C generated in the primary side series circuit 36 and a magnetic field D generated in the secondary side series circuit 37 are respectively generated in directions that make the magnetic fields repel each other, such that a magnetic barrier E is formed between the magnetic fields C and D. As a result, a high-frequency signal current indicated by an arrow k flows in the antenna terminal 43, and a high-frequency signal current indicated by an arrow 1 flows in the ground terminal 42. Note that when the direction of a current (arrow a) flowing through the feeding terminal 41 is reversed, directions of other currents are also reversed. Since the conductor 63 of the first inductance element L1 faces the coil pattern 65 of the third inductance element L3, electric field coupling is generated and a current (displacement current) caused to flow by this electric field coupling flows in the same direction as the induced current, such that the degree of coupling is increased by the magnetic field coupling and the electric field coupling. Similarly, magnetic field coupling and electric field coupling are generated also between the coil pattern 64 of the second inductance element L2 and the coil pattern 66 of the fourth inductance element L4.

In the primary side series circuit 36, the first and second inductance elements L1 and L2 are coupled to each other in an in-phase mode, and in the secondary side series circuit 37, the third and fourth inductance elements L3 and L4 are coupled to each other in an in-phase mode, such that closed magnetic paths are respectively provided. Hence, energy loss between the first inductance element L1 and the second inductance element L2 and energy loss between the third inductance element L3 and the fourth inductance element L4 can be made small. Note that by making the first inductance element L1 and the second inductance element L2 have the same or substantially the same inductance and making the third inductance element L3 and the fourth inductance element L4 have the same or substantially the same inductance, leakage of magnetic flux from the closed magnetic paths is reduced and energy loss is significantly reduced or prevented. Since the third inductance element L3 and the fourth inductance element L4 are coupled to each other through an electric field via the ground conductor 68, a displacement current caused to flow by this electric field coupling increases the degree of coupling between the third and fourth inductance elements L3 and L4. Similarly, by making an electric field generated between the first and second inductance elements L1 and L2, the degree of coupling between the first and second inductance elements L1 and L2 is increased.

The magnetic field C excited by a primary current in the primary side series circuit 36 and the magnetic field D excited by a secondary current in the secondary side series circuit 37 are generated so as to cancel each other out through an induced current. By using an induced current, energy loss is reduced and the first inductance element L1 and the second inductance element L2 are respectively coupled to the third inductance element L3 and the fourth inductance element L4 with a high degree of coupling. In other words, the primary side series circuit 36 and the secondary side series circuit 37 are coupled to each other with a high degree of coupling. By making the first and second inductance elements L1 and L2 be coupled to each other in an in-phase mode and making the third and fourth inductance elements L3 and L4 be coupled to each other in an in-phase mode, the inductance of the frequency stabilizing circuit 35 is reduced.

As described above, according to the present first example, since the coupling between the primary side series circuit 36 and the secondary side series circuit 37 is based on coupling (electromagnetic coupling) between a closed magnetic path and a closed magnetic path, impedance matching can be performed independently on the primary side and the secondary side by performing impedance matching with the feeding circuit 30 at the primary side series circuit 36 and performing impedance matching with the frame-shaped radiating element 11 at the secondary side series circuit 37. Further, since the transmission efficiency of high-frequency signal energy is increased, the frequency characteristics of a high-frequency signal is stabilized in a wide band without being influenced by the shapes of the radiating elements 11 and 21 and the casing 2 or the open/closed state of the casing 2.

Figure 14:
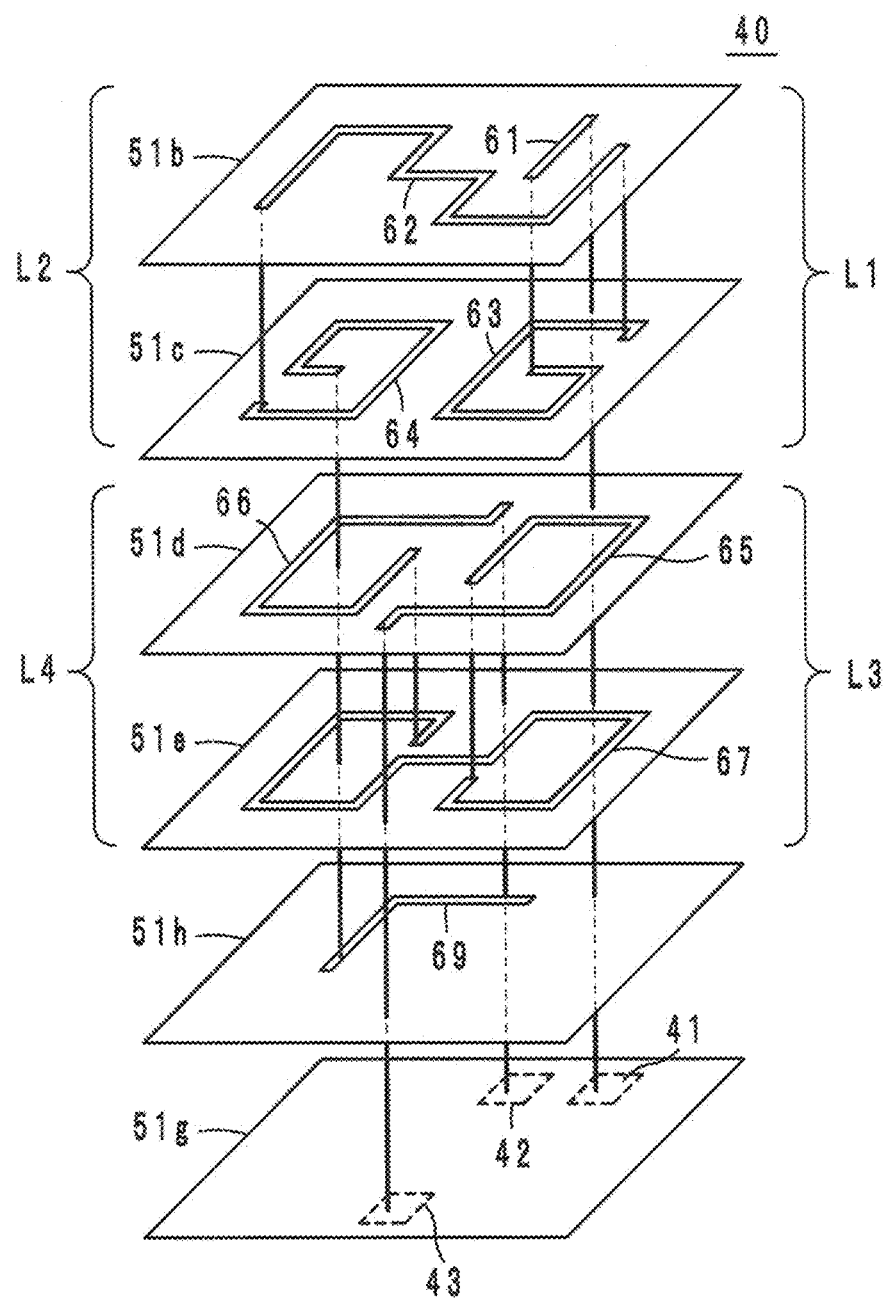
FIG. 14 is an exploded perspective view of a second configuration example of the frequency stabilizing circuit including a multilayer body.

Next, a second configuration example of the frequency stabilizing circuit 35 will be described with reference to FIG. 14. The configuration of this second configuration example preferably is basically the same as that of the first configuration example. Unlike the first configuration example, in the second configuration example, the conductor 61 is provided on the base material layer 51b while the base material layer 51a is omitted, and a connection conductor 69 is provided on a base material layer 51h while the ground conductor 68 is omitted. In the second configuration example, since the ground conductor 68 is omitted, it is preferable to provide a shield conductor corresponding to the ground conductor 68 on a printed wiring board on which the multilayer body 40 is mounted.

Second Example of Frequency Stabilizing Circuit

Figure 15:
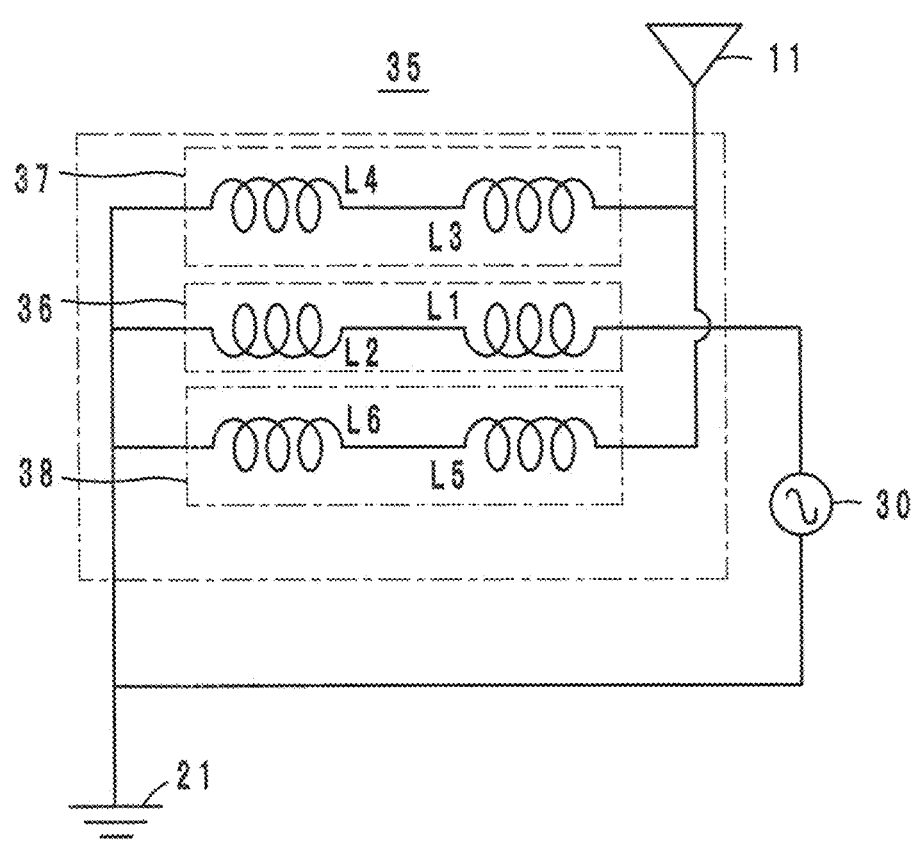
FIG. 15 is an equivalent circuit diagram of the second example of the frequency stabilizing circuit.

A frequency stabilizing circuit of a second example is illustrated in FIG. 15. A frequency stabilizing circuit 35 used here includes another secondary side series circuit 38 (secondary reactance circuit) in addition to the primary side series circuit 36 and the secondary side series circuit 37 described above. A fifth inductance element L5 and a sixth inductance element L6 defining the secondary side series circuit 38 are coupled to each other in an in-phase mode. The fifth inductance element L5 is coupled to the first inductance element L1 in an opposite-phase mode, and the sixth inductance element L6 is coupled to the second inductance element L2 in an opposite-phase mode. An end of the fifth inductance element L5 is connected to the frame-shaped radiating element 11, and an end of the sixth inductance element L6 is connected to the plate-shaped radiating element 21.

Figure 16:
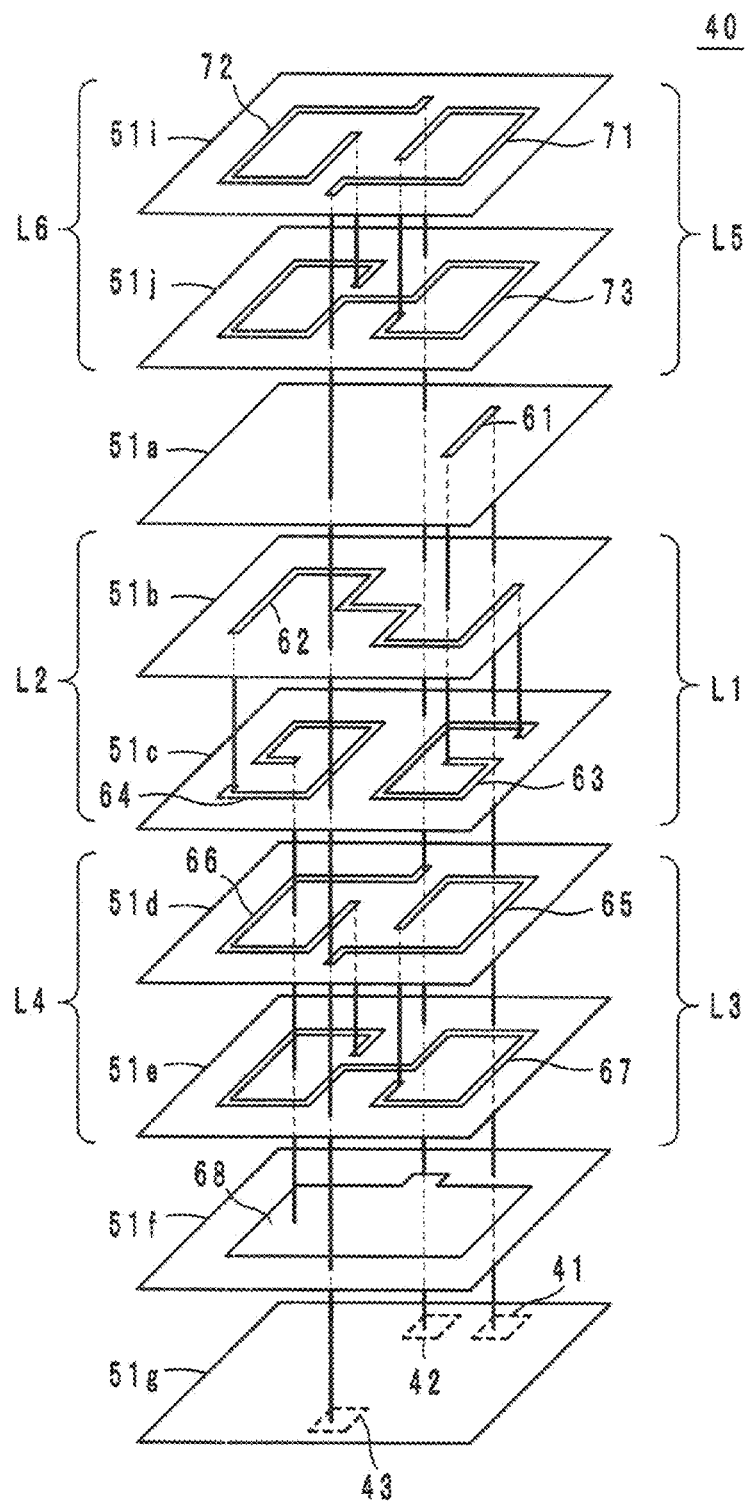
FIG. 16 is an exploded perspective view of a third configuration example of the frequency stabilizing circuit including a multilayer body.

A third configuration example of this frequency stabilizing circuit 35 including a multilayer body 40 will be described with reference to FIG. 16. In this third configuration example, base material layers 51*i* and 51*j* on which conductors 71, 72, and 73 defining the fifth inductance element L5 and the sixth inductance element L6 of the secondary side series circuit 38 are provided are further stacked on the multilayer body 40 illustrated in the first configuration example. That is, similarly to the first to fourth reactance elements described above, fifth and sixth reactance elements are respectively defined by the fifth and sixth inductance elements L5 and L6, and the fifth and sixth inductance elements L5 and L6 are defined by coil patterns. The coil patterns of the fifth and sixth inductance elements L5 and L6 are wound such that magnetic fields generated in the fifth and sixth inductance elements L5 and L6 define a closed magnetic path.

The operations of the second example and the third configuration example of the multilayer body 40 are basically similar to those of the first example and the first configuration example. In the second example, since the primary side series circuit 36 is sandwiched between the two secondary side series circuits 37 and 38, energy loss in transmission of a high-frequency signal from the primary side series circuit 36 to the secondary side series circuits 37 and 38 is reduced.

Figure 17:
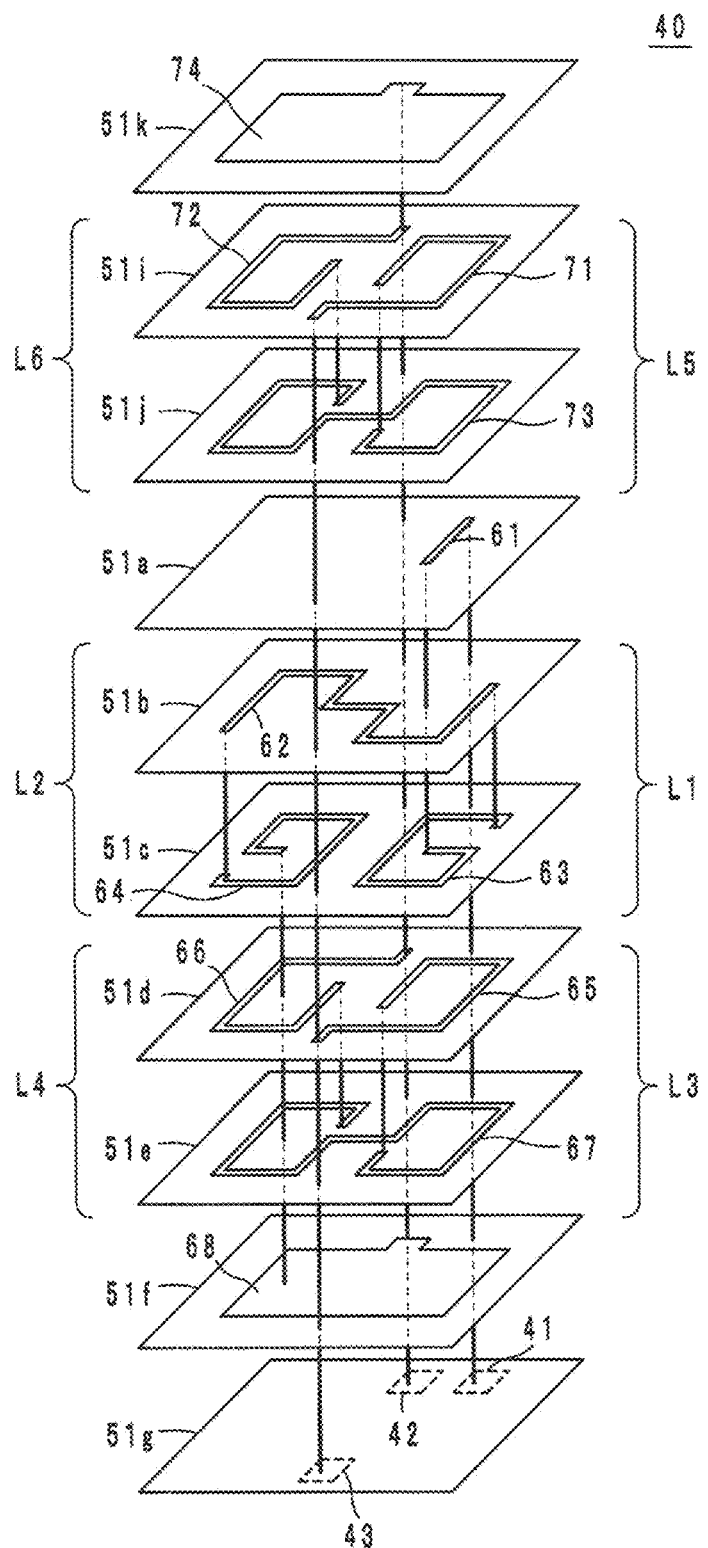
FIG. 17 is an exploded perspective view of a fourth configuration example of the frequency stabilizing circuit including a multilayer body.

Referring to FIG. 17, a fourth configuration example of the frequency stabilizing circuit 35 including a multilayer body 40 will be described. In the fourth configuration example, a base material layer 51*k* having a ground conductor 74 located thereon is further stacked on the multilayer body 40 of the third configuration example. The ground conductor 74 has an area sufficient to cover the openings of the coils defined by the conductors 71, 72, and 73, similarly to the ground conductor 68 provided on the bottom. Hence, in the fourth configuration example, by providing the ground conductor 74, magnetic fields defined by the coils become unlikely to be influenced by various wiring lines arranged directly above the multilayer body 40. In this manner, even when the first and second inductance elements L1 and L2 are coupled to each other in an in-phase mode and the third and fourth inductance elements L3 and L4 are coupled to each other in an in-phase mode, the primary side series circuit and the secondary side series circuit 37 can be coupled to each other.

Third Example of Frequency Stabilizing Circuit

Figure 18:
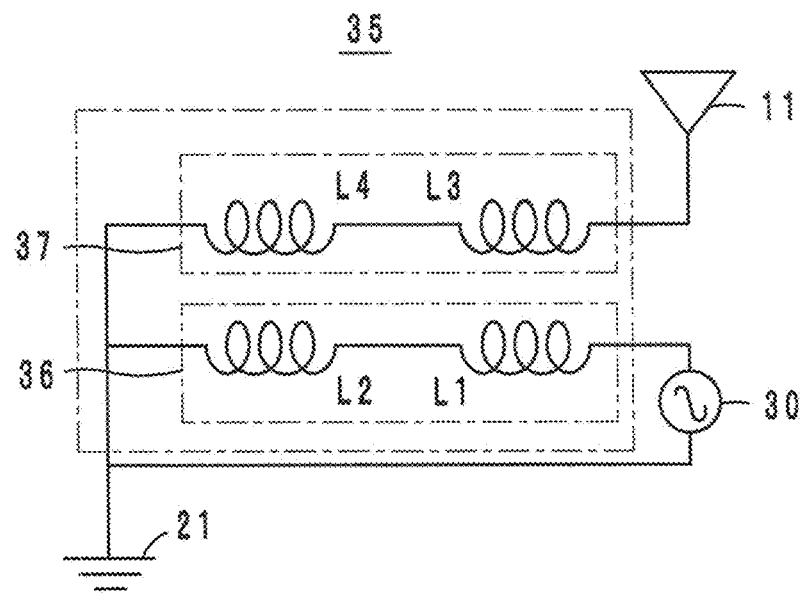
FIG. 18 is an equivalent circuit diagram of the third example of the frequency stabilizing circuit.

A frequency stabilizing circuit of a third example is illustrated in FIG. 18. A frequency stabilizing circuit 35 used here preferably basically has a configuration similar to that of the first example. Unlike the first example, the first inductance element L1 and the third inductance element L3 are coupled to each other in an in-phase mode, and the second inductance element L2 and the fourth inductance element L4 are coupled to each other in an in-phase mode. That is, the first and third inductance elements L1 and L3 are coupled to each other mainly through a magnetic field, and the second and fourth inductance elements L2 and L4 are coupled to each other mainly through a magnetic field. The operation and effect of the third example are basically similar to those of the first example.

By winding the coil patterns of the inductance elements L1 to L4 in this manner, a closed magnetic path (first closed magnetic path) located between the first inductance element L1 and the second inductance element L2, a closed magnetic path (second closed magnetic path) located between the third inductance element L3 and the fourth inductance element L4, and a closed magnetic path (third closed magnetic path) defined by these first and second closed magnetic paths are provided and, hence, the loss of a high-frequency signal in the inductance elements L1 to L4 is significantly reduced or prevented.

Fourth Example of Frequency Stabilizing Circuit

Figure 19:
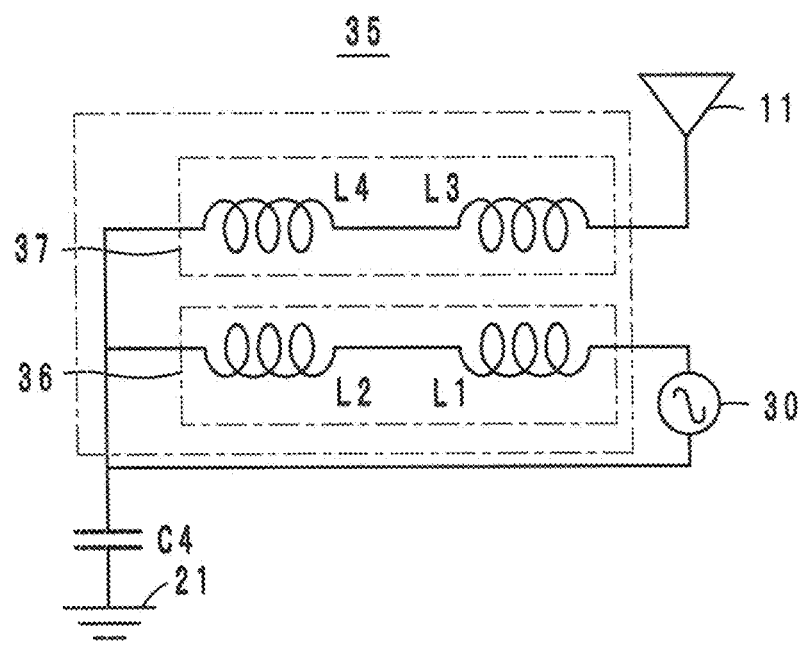
FIG. 19 is an equivalent circuit diagram of the fourth example of the frequency stabilizing circuit.

A frequency stabilizing circuit of a fourth example is illustrated in FIG. 19. A frequency stabilizing circuit 35 used here preferably has basically a configuration similar to that of the first example, and the operation and effect of the fourth example are similar to those of the first example. Unlike the first example, a capacitance element C4 is arranged between the frequency stabilizing circuit 35 and the plate-shaped radiating element 21. The capacitance element C4, which cuts off a DC component and a low-frequency component, functions as a bias-cutting device and also as an ESD suppressor.

Figure 20:
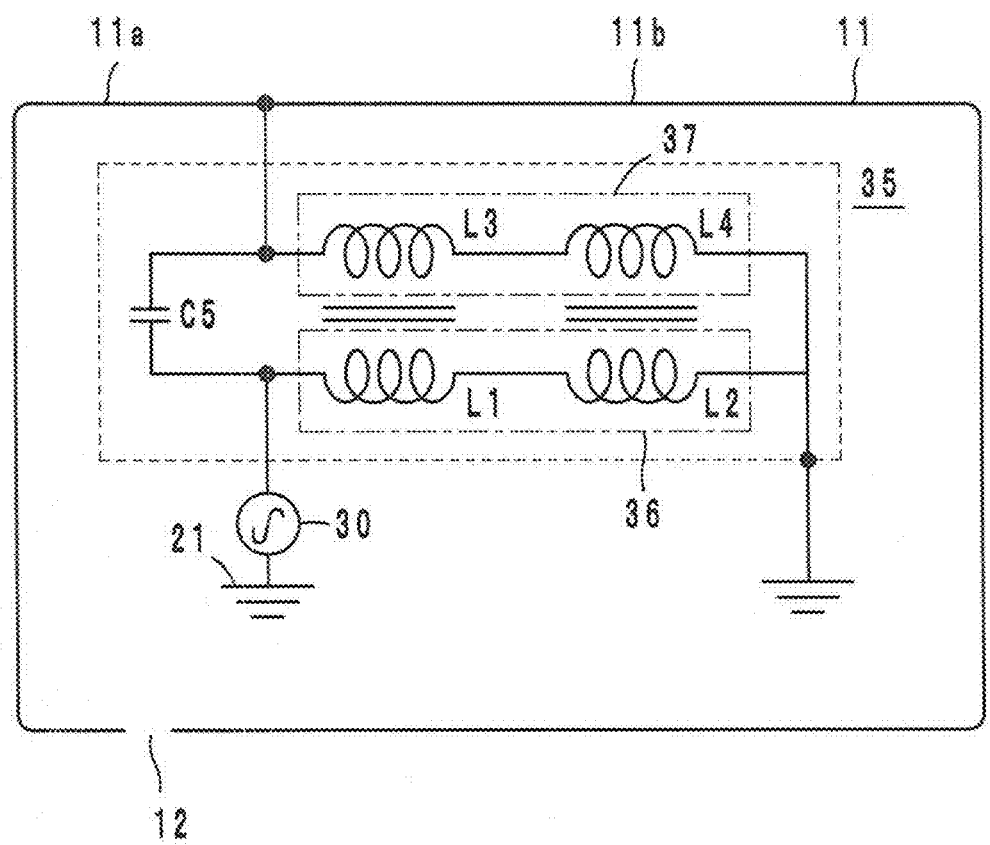
FIG. 20 is an equivalent circuit diagram of a fifth example of the frequency stabilizing circuit.

Fifth Example of Frequency Stabilizing Circuit (Refer to FIG. 20)

A frequency stabilizing circuit of a fifth example is illustrated in FIG. 20. This frequency stabilizing circuit 35 is preferably used in a multi-band mobile wireless communication system (800 MHz band, 900 MHz band, 1800 MHz band, and 1900 MHz band) that can support a GSM (registered trademark) system and a CDMA system, for example. In this frequency stabilizing circuit 35, a capacitor C5 is inserted between the primary side series circuit 36 and the secondary side series circuit 37. The rest of the configuration preferably is similar to that of the first example, and the operation and effect are basically similar to those of the first example. Branch monopole antennas 11*a* and 11*b* are preferably provided as the frame-shaped radiating element 11. This configuration preferably is the same as that of the frame-shaped radiating element 11 provided with the gap 12 described with reference to FIGS. 4A and 4B.

Note that the capacitor C5 functions as a coupling capacitor to cause a signal in a high band (1800 MHz, 1900 MHz) to mainly flow from the branch monopole antennas 11*a* and 11*b* to the feeding circuit 30 (or vice versa) without via the primary side series circuit 36 and the secondary side series circuit 37. When the impedance ratios provided in the primary side series circuit 36 and the secondary side series circuit 37 match both in the high band side (1800 MHz band, 1900 MHz band) and the low band side (800 MHz band, 900 MHz band), it is not necessary to provide the capacitor C5.

An antenna device that uses this frequency stabilizing circuit 35 can be used as a main antenna of a mobile communication terminal apparatuses. In the branch monopole antennas 11*a* and 11*b*, the antenna 11*a* mainly functions as an antenna radiating element of the high band side (1800-2400 MHz band), and the antennas 11*a* and 11*b* both function as an antenna radiating element of the low band side (800-900 MHz band). Here, the branch monopole antennas 11*a* and 11*b* need not resonate in the respective supported frequency bands. The reason for this is that the frequency stabilizing circuit 35 makes the characteristic impedances of the antennas 11a and 11b match the impedance of the RF circuit. For example, in the 800-900 MHz band, the frequency stabilizing circuit 35 makes the characteristic impedances of the antennas 11a and 11b match the impedance (usually 50Ω, for example) of the RF circuit. As a result, signals of the RF circuit can be transmitted from the antennas 11a and 11b, and signals to the RF circuit can be received at the antennas 11a and 11b.

Note that when impedance matching is to be performed for a plurality of frequency bands which are considerably spaced apart from one another as described above, impedance matching may be performed in each of the frequency bands by arranging a plurality of frequency stabilizing circuits 35, for example. Alternatively, by providing a plurality of secondary side series circuits 37 coupled to the primary side series circuit 36, impedance matching may be performed in each of the frequency bands using the plurality of secondary side series circuit 37.

Sixth Example of Frequency Stabilizing Circuit

Figure 21A:
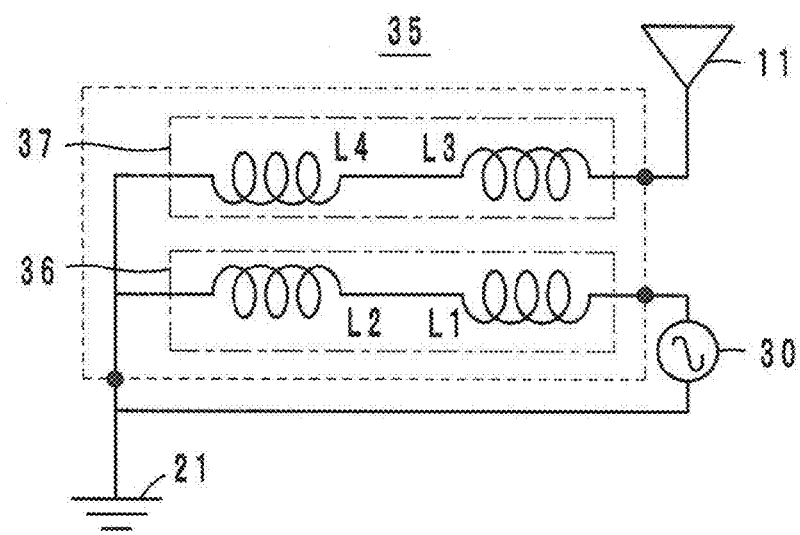
FIGS. 21A and 21B are equivalent circuit diagrams of a sixth example of the frequency stabilizing circuit.

Referring to FIG. 21A, a frequency stabilizing circuit 35 of a sixth example includes a primary side reactance circuit connected to the feeding circuit 30 and a secondary side reactance circuit coupled to the primary side reactance circuit through an electric field or a magnetic field. The primary side reactance circuit includes a primary side series circuit 36 that includes a first reactance element and a second reactance element connected in series with the first reactance element. The secondary side reactance circuit includes a secondary side series circuit 37 that includes a third reactance element coupled to the first reactance element and a fourth reactance element connected in series with the third reactance element and coupled to the second reactance element. Specifically, the first reactance element includes a first inductance element L1, the second reactance element includes a second inductance element L2, the third reactance element includes a third inductance element L3, and the fourth reactance element includes a fourth inductance element L4.

One end of the primary side series circuit 36 (a first end of the first inductance element L1) is connected to the feeding circuit 30, and one end of the secondary side series circuit 37 (a first end of the third inductance element L3) is connected to the frame-shaped radiating element 11. The other end of the primary side series circuit 36 (a second end of the second inductance element L2) and the other end of the secondary side series circuit 37 (a second end of the fourth inductance element L4) are connected to the plate-shaped radiating element 21.

Figure 21B:
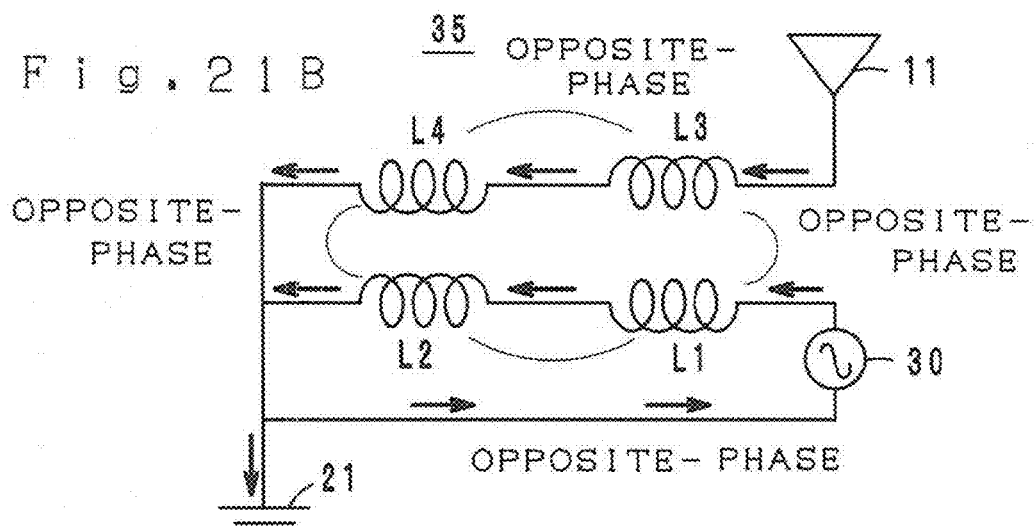

Referring to FIG. 21B, the first inductance element L1 and the second inductance element L2 are coupled to each other in an opposite-phase mode and similarly, the third inductance element L3 and the fourth inductance element L4 are coupled to each other in an opposite-phase mode. The first inductance element L1 and the third inductance element L3 are coupled to each other in an opposite-phase mode, and similarly, the second inductance element L2 and the fourth inductance element L4 are coupled to each other in an opposite-phase mode.

In the frequency stabilizing circuit 35 having the above configuration, a high-frequency current flowing into the primary side series circuit 36 from the feeding circuit 30 flows through the first inductance element L1, and flows through the third inductance element L3 as a secondary current through an induced magnetic field when the inductance elements include coil patterns. The high-frequency signal current that flows through the second inductance element L2 flows through the fourth inductance element L4 as a secondary current through an induced magnetic field. As a result, the high-frequency signal currents flow in the directions indicated by the arrows in FIG. 21B.

In the configuration of the sixth example, the first inductance element L1 and the second inductance element L2 operate so as to increase each other's magnetic fields, and the third inductance element L3 and the fourth inductance element L4 also operate in such a manner as to increase each other's magnetic fields. A closed magnetic path is provided between the primary side series circuit 36 and the secondary side series circuit 37.

Figure 22:
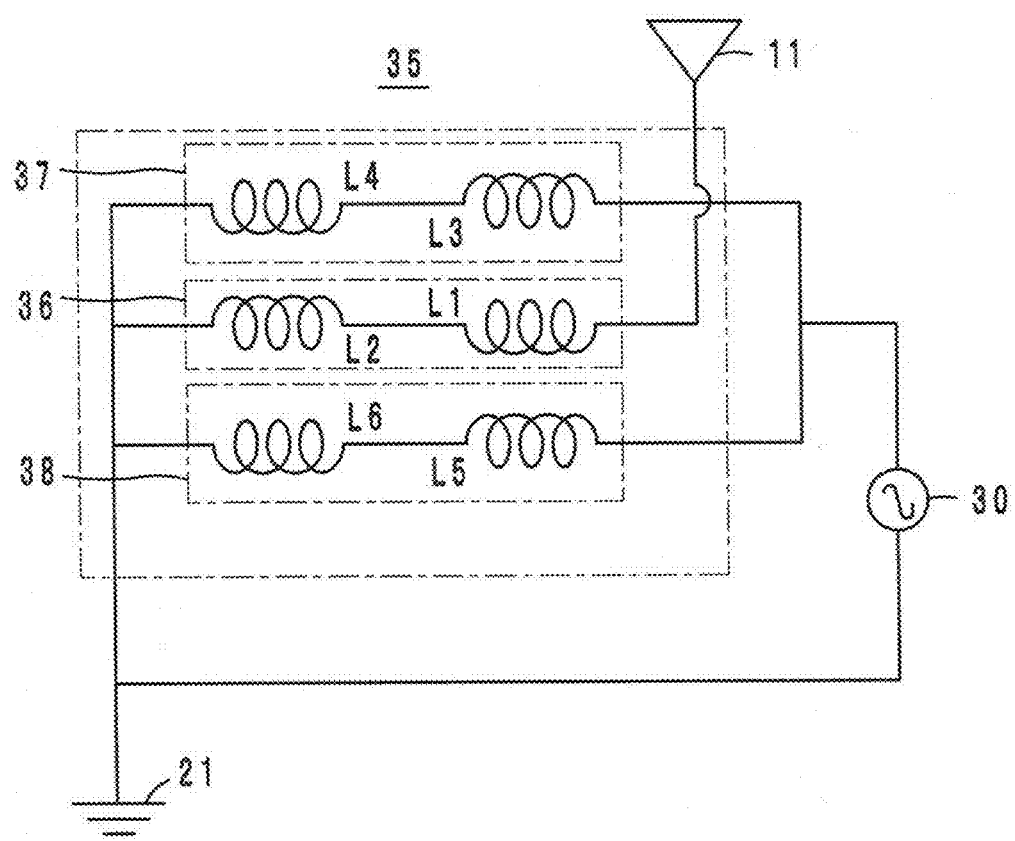
FIG. 22 is an equivalent circuit diagram of an application example of the sixth example of the frequency stabilizing circuit.

Hence, referring to FIG. 22, by making the primary side series circuit 36 be sandwiched between the first secondary side series circuit 37 including a series circuit of the third inductance element L3 and the fourth inductance element L4 and a second secondary side series circuit 38 including a series circuit of a fifth inductance element L5 and a sixth inductance element L6, energy loss in transmission of a high-frequency signal from the secondary side series circuits 37 and 38 to the primary side series circuit 36 is reduced. Note that in the configuration of the present application example, the winding directions of the inductance elements L2, L4, and L6 are also changed compared with the frequency stabilizing circuit 35 illustrated in FIG. 15.

Seventh Example of Frequency Stabilizing Circuit

Figure 23A:
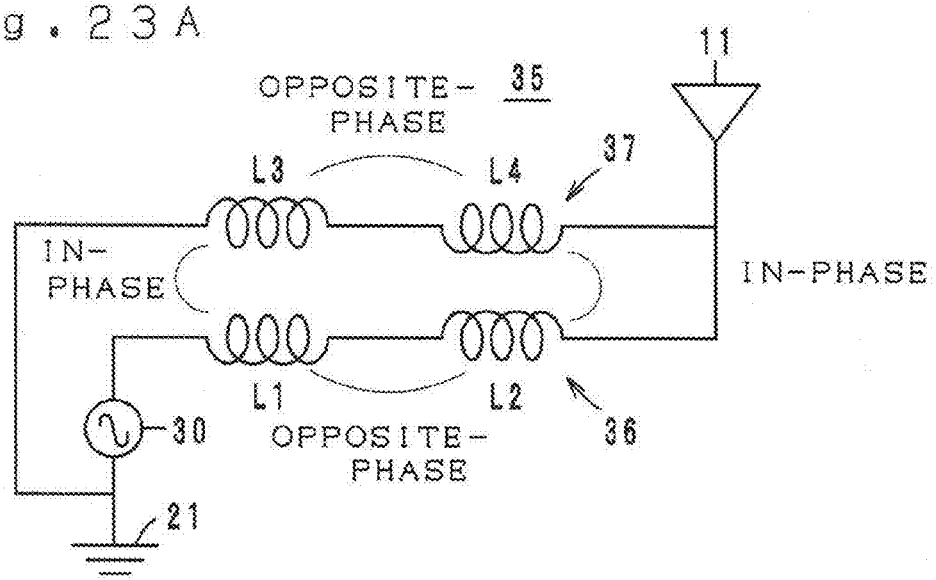
FIGS. 23A and 23B illustrate a seventh example of the frequency stabilizing circuit, where
Figure 23B:
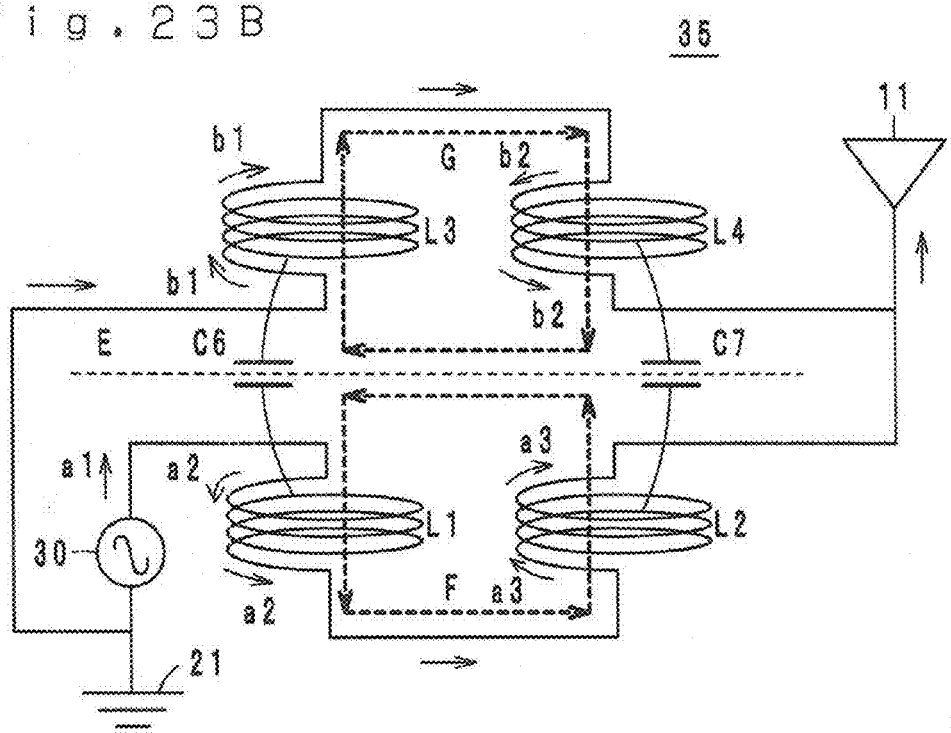

Referring to FIG. 23A, a frequency stabilizing circuit 35 of a seventh example includes a primary side series circuit 36 connected to a feeding circuit 30 and a secondary side series circuit 37 coupled to the primary side series circuit 36 through an electric field or a magnetic field. The primary side series circuit 36 includes a first inductance element L1 and a second inductance element L2 which are connected in series and wound in an opposite-phase mode and which define a closed magnetic path. The secondary side series circuit 37 includes a third inductance element L3 and a fourth inductance element L4 which are connected in series and wound in opposite directions and which define a closed magnetic path. In other words, the first and second inductance elements L1 and L2 are coupled to each other with additive polarities, and the third and fourth inductance elements L3 and L4 are coupled to each other with additive polarities. The first inductance element L1 and the third inductance element L3 are coupled to each other in an in-phase mode, and similarly, the second inductance element L2 and the fourth inductance element L4 are coupled to each other in an in-phase mode. In other words, the first inductance element L1 and the third inductance element L3 are coupled to each other with subtractive polarities and the second inductance element L2 and the fourth inductance element L4 are coupled to each other with subtractive polarities. Further, as illustrated in FIG. 23B, the first and third inductance elements L1 and L3 are coupled also through an electric field, and the second and fourth inductance elements L2 and L4 are similarly coupled to each other also through an electric field. Capacitors C6 and C7 in FIG. 23B symbolically represent coupling capacitances for the above-described electric field coupling. In the seventh example having the above-described coupling form, a high degree of coupling, e.g., 0.1 or above, or even 0.5 or above, for example, between the primary side series circuit 36 and the secondary side series circuit 37 is obtained.

One end of the primary side series circuit 36 (a first end of the first inductance element L1) is connected to the feeding circuit 30, and the other end of the primary side series circuit 36 (a second end of the second inductance element L2) and one end of the secondary side series circuit 37 (a second end of the fourth inductance element L4) are connected to the frame-shaped radiating element 11. The other end of the secondary side series circuit 37 (a first end of the third inductance element L3) is connected to the plate-shaped radiating element 21.

In the frequency stabilizing circuit 35 having the configuration described above, the third inductance element L3 arranged such that when a high-frequency signal flows through the first inductance element L1, the direction of an induced current caused by a magnetic field is the same as the direction of a current induced by electric coupling. In other words, referring to FIG. 23B, when a high-frequency signal is supplied from the feeding circuit 30 in a direction indicated by an arrow a1, a current flows through the first inductance element L1 in a direction indicated by an arrow a2 and a current flows through the second inductance element L2 in a direction indicated by an arrow a3. These currents cause a closed magnetic path of a magnetic field F. On the other hand, the magnetic field F causes a closed magnetic path of a magnetic field G to be provided in the third and fourth inductance elements L3 and L4. Further, since the first and third inductance elements L1 and L3 are coupled to each other through an electric field and the second and fourth inductance elements L2 and L4 are coupled to each other through an electric field, when a high-frequency signal flows through the first and second inductance elements L1 and L2, an induced current due to the magnetic field and a current induced by the electric field coupling flow in the third and fourth inductance elements L3 and L4 in directions indicated by arrows b1 and b2. In this manner, a magnetic barrier E is provided between the primary side series circuit 36 and the secondary side series circuit 37.

Other Preferred Embodiments

Note that the antenna devices and communication terminal apparatuses according to the present invention are not limited to the preferred embodiments described above, and various modifications are possible with the scope of the present invention.

For example, the present invention can be applied not only to 1-seg but also to various communication systems (800 MHz band, 900 MHz band, 1800 MHz band, 1900 MHz band, and the like, for example) including mobile wireless communication systems such as GSM (registered trademark) and CDMA, short-distance wireless systems (2.4 GHz band) such as Bluetooth (registered trademark) and W-LAN, and GPS systems (1.5 GHz band), for example.

The form of the frequency stabilizing circuit is not only limited to a chip-type multilayer body but the frequency stabilizing circuit may be also configured as a module integrated with another device such as a strip line or as a module mounted on or built in a printed wiring board provided with a radiating body. Further, other than the configuration in which a set of the primary side series circuit and the secondary side series circuit are provided, the frequency stabilizing circuit may be configured to include a plurality of the sets in multiple stages. The set of the primary side series circuit sandwiched between the secondary side series circuits described in the second example may be provided in a plurality in multiple stages. By employing the multiple stages, energy loss in transmission of a high-frequency signal is reduced, and attenuation of return loss becomes steep.

As described above, preferred embodiments of the present invention are useful for antenna devices and communication terminal apparatuses, and in particular, preferred embodiments of the present invention provide an advantage in that the frequency of a high-frequency signal is stabilized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna device comprising:
   a plate-shaped radiating element;
   a frame-shaped radiating element arranged to surround the plate-shaped radiating element; and
   a feeding unit that includes a feeding circuit and a frequency stabilizing circuit and that is connected between the plate-shaped radiating element and the frame-shaped radiating element; wherein
   the plate-shaped radiating element and the frame-shaped radiating element are connected to the feeding circuit through the frequency stabilizing circuit as a result of a first terminal portion of the frequency stabilizing circuit being connected to the frame-shaped radiating element, a second terminal portion of the frequency stabilizing circuit being connected to the plate-shaped radiating element, and a third terminal portion of the frequency stabilizing circuit being connected to the feeding circuit.

2. The antenna device according to claim 1, wherein a portion of the frame-shaped radiating element includes a cut-out that defines a gap.

3. The antenna device according to claim 1, wherein the frequency stabilizing circuit includes a primary side reactance circuit connected to the feeding circuit and a secondary side reactance circuit coupled to the primary side reactance circuit through an electric field and/or a magnetic field.

4. The antenna device according to claim 3, wherein
   the primary side reactance circuit includes a primary side series circuit including a first reactance element and a second reactance element connected in series with the first reactance element; and
   the secondary side reactance circuit includes a secondary side series circuit including a third reactance element coupled to the first reactance element and a fourth reactance element connected in series with the third reactance element and coupled to the second reactance element.

5. The antenna device according to claim 4, wherein the first reactance element and the second reactance element are coupled to each other in an opposite-phase mode, and the third reactance element and the fourth reactance element are coupled to each other in an opposite-phase mode.

6. The antenna device according to claim 4, wherein the first reactance element and the third reactance element are coupled to each other in an opposite-phase mode, and the second reactance element and the fourth reactance element are coupled to each other in an opposite-phase mode.

7. The antenna device according to claim 4, wherein the first reactance element and the third reactance element are coupled to each other in an in-phase mode, and the second reactance element and the fourth reactance element are coupled to each other in an in-phase mode.

8. The antenna device according to claim 4, wherein each of the first, second, third, and fourth reactance elements is an inductance element.

9. A communication terminal apparatus comprising:
   a plate-shaped radiating element arranged within a casing;
   a frame-shaped radiating element arranged along an inner side surface or an outer side surface of the casing to surround the plate-shaped radiating element; and
   a feeding unit that includes a feeding circuit and a frequency stabilizing circuit and that is connected between the plate-shaped radiating element and the frame-shaped radiating element; wherein the plate-shaped radiating element and the frame-shaped radiating element are connected to the feeding circuit through the frequency stabilizing circuit as a result of a first terminal portion of the frequency stabilizing circuit being connected to the frame-shaped radiating element, a second terminal portion of the frequency stabilizing circuit being connected to the plate-shaped radiating element, and a third terminal portion of the frequency stabilizing circuit being connected to the feeding circuit.

10. The communication terminal apparatus according to claim 9, wherein a portion of the frame-shaped radiating element includes a cut-out that defines a gap.

11. The communication terminal apparatus according to claim 9, wherein the frequency stabilizing circuit includes a primary side reactance circuit connected to the feeding circuit and a secondary side reactance circuit coupled to the primary side reactance circuit through an electric field and/or a magnetic field.

12. The communication terminal apparatus according to claim 11, wherein
the primary side reactance circuit includes a primary side series circuit including a first reactance element and a second reactance element connected in series with the first reactance element; and
the secondary side reactance circuit includes a secondary side series circuit including a third reactance element coupled to the first reactance element and a fourth reactance element connected in series with the third reactance element and coupled to the second reactance element.

13. The communication terminal apparatus according to claim 12, wherein the first reactance element and the second reactance element are coupled to each other in an opposite-phase mode, and the third reactance element and the fourth reactance element are coupled to each other in an opposite-phase mode.

14. The communication terminal apparatus according to claim 12, wherein the first reactance element and the third reactance element are coupled to each other in an opposite-phase mode, and the second reactance element and the fourth reactance element are coupled to each other in an opposite-phase mode.

15. The communication terminal apparatus according to claim 12, wherein the first reactance element and the third reactance element are coupled to each other in an in-phase mode, and the second reactance element and the fourth reactance element are coupled to each other in an in-phase mode.

16. The communication terminal apparatus according to claim 12, wherein each of the first, second, third, and fourth reactance elements is an inductance element.

* * * * *